(12) United States Patent
Lin et al.

(10) Patent No.: US 12,401,320 B2
(45) Date of Patent: Aug. 26, 2025

(54) PHOTOVOLTAIC SYSTEM, POWER SUPPLY SYSTEM, AND INSULATION FAULT DETECTION METHOD

(71) Applicant: Huawei Digital Power Technologies Co., Ltd., Shenzhen (CN)

(72) Inventors: Jianfei Lin, Shenzhen (CN); Yongbing Gao, Shanghai (CN); Tiansan Lin, Shenzhen (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 196 days.

(21) Appl. No.: 18/450,528

(22) Filed: Aug. 16, 2023

(65) Prior Publication Data

US 2023/0402972 A1 Dec. 14, 2023

Related U.S. Application Data

(63) Continuation of application No. PCT/CN2021/077398, filed on Feb. 23, 2021.

(51) Int. Cl.
*G01R 31/14* (2006.01)
*H02J 1/10* (2006.01)
*H02S 50/00* (2014.01)

(52) U.S. Cl.
CPC .............. *H02S 50/00* (2013.01); *G01R 31/14* (2013.01); *H02J 1/10* (2013.01); *H02J 2300/24* (2020.01)

(58) Field of Classification Search
None
See application file for complete search history.

(56) References Cited

U.S. PATENT DOCUMENTS

| | | | | |
|---|---|---|---|---|
| 10,411,479 | B2* | 9/2019 | Weng | H02J 3/381 |
| 11,979,019 | B2* | 5/2024 | Wang | H02H 3/06 |
| 2017/0302082 | A1 | 10/2017 | Weng et al. | |
| 2022/0136721 | A1* | 5/2022 | Qu | F24F 11/88 |
| | | | | 700/300 |

(Continued)

FOREIGN PATENT DOCUMENTS

| | | | |
|---|---|---|---|
| CN | 105606897 A | | 5/2016 |
| CN | 106208129 A | | 12/2016 |

(Continued)

OTHER PUBLICATIONS

English translation of EP 4287504-A1 (Year: 2023).*
English translation of EP 4024641-B1 (Year: 2024).*

*Primary Examiner* — Jermele M Hollington
(74) *Attorney, Agent, or Firm* — Maier & Maier, PLLC

(57) ABSTRACT

A photovoltaic system, a power supply system, and an insulation fault detection method. An insulation impedance detection circuit is connected between a bus and the ground. The bus includes the direct current positive bus, the neutral bus, or the direct current negative bus. The insulation impedance detection circuit includes at least a switch. The direct current negative bus is connected to the neutral bus by using an electrical element or a voltage source. A controller obtains insulation impedance based on voltages to ground of the bus that are separately corresponding to the switch before and after the switch is turned on, and determines, based on the insulation impedance, whether there is an insulation fault in the photovoltaic system, to perform protection in a timely manner.

20 Claims, 14 Drawing Sheets

(56) References Cited

U.S. PATENT DOCUMENTS

2022/0326294 A1* 10/2022 Wang ................... G01R 31/14
2023/0378908 A1* 11/2023 Lin ....................... H02S 50/00

FOREIGN PATENT DOCUMENTS

| CN | 106452358 B | 7/2018 | | |
|----|----|----|----|----|
| CN | 106603007 B | 9/2018 | | |
| EP | 4287504 A1 * | 12/2023 | ............. | G01R 31/14 |
| EP | 4024641 B1 * | 10/2024 | ........... | H02H 1/0007 |

* cited by examiner

PHOTOVOLTAIC SYSTEM, POWER SUPPLY SYSTEM, AND INSULATION FAULT DETECTION METHOD

CROSS-REFERENCE TO RELATED APPLICATIONS

This application is a continuation of International Application No. PCT/CN2021/077398, filed on Feb. 23, 2021, the disclosure of which is hereby incorporated by reference in its entirety.

TECHNICAL FIELD

The embodiments relate to the field of photovoltaic power generation technologies, a photovoltaic system, a power supply system, and an insulation fault detection method.

BACKGROUND

Photovoltaic power generation is to convert solar energy into electric energy. A photovoltaic system may include a photovoltaic array and a power conversion circuit. Because the photovoltaic array outputs a direct current, and an alternating current power grid is an alternating current, an inverter is required to convert the direct current output by the photovoltaic array into an alternating current and feed back the alternating current to the alternating current power grid.

During actual running of the photovoltaic system, an insulation fault may occur. When the insulation fault occurs, the insulation fault may need to be found in a timely manner, and the inverter needs to be controlled to stop running, to prevent a range of the insulation fault from being expanded and affecting running of the entire photovoltaic system.

However, all existing insulation fault detection manners are for a conventional photovoltaic system with a single direct current bus, and comprehensive insulation fault detection cannot be implemented for a photovoltaic system with dual direct current buses.

SUMMARY

The embodiments may provide a photovoltaic system, a power supply system, and an insulation fault detection method, to implement insulation fault detection for a photovoltaic system with dual direct current buses.

An embodiment may provide a photovoltaic system. The photovoltaic system is different from a conventional unipolar photovoltaic system. The photovoltaic system includes three buses: a direct current positive bus, a neutral bus, and a direct current negative bus. The neutral bus may be an open line, or may be a potential, provided that potentials corresponding to a neutral bus on a photovoltaic side and a neutral bus on an inverter side are consistent. A direct current bus voltage includes both a positive voltage and a negative voltage. The photovoltaic system includes a first DC/DC circuit, a second DC/DC circuit, a negative voltage circuit, an insulation impedance detection circuit, and a controller. An input end of the first DC/DC circuit and an input end of the second DC/DC circuit are respectively connected to respective corresponding photovoltaic strings. A positive output end and a negative output end of the first DC/DC circuit are respectively connected to the direct current positive bus and the neutral bus. A positive output end and a negative output end of the second DC/DC circuit are respectively connected to a first input end and a second input end of the negative voltage circuit. A first output end and a second output end of the negative voltage circuit are respectively connected to the neutral bus and the direct current negative bus. The negative output end of the second DC/DC circuit is connected to the neutral bus. The insulation impedance detection circuit is connected between a bus and the ground, and the bus includes the direct current positive bus, the neutral bus, or the direct current negative bus. The insulation impedance detection circuit includes at least a switch. The direct current negative bus is connected to the neutral bus by using an electrical element or a voltage source. The controller obtains insulation impedance based on voltages to ground of the bus that are separately corresponding to the switch before and after the switch is turned on, and detects, based on the insulation impedance, whether there is an insulation fault in the photovoltaic system.

The photovoltaic system provided in this embodiment may include the insulation impedance detection circuit. The insulation impedance detection circuit may be connected between any one of the three buses and the ground. To comprehensively detect the insulation impedance of the photovoltaic system, the direct current negative bus is equivalent to the neutral bus; in other words, the direct current negative bus is connected to the neutral bus by using the voltage source or the electrical element, to form a conduction path between the direct current negative bus and the neutral bus. Because the insulation impedance detection circuit includes the switch, a voltage to ground of the bus connected to the insulation impedance detection circuit is obtained once before the switch is turned on, and a voltage to ground of the bus connected to the insulation impedance detection circuit is obtained once after the switch is turned on. An equation including a voltage and a resistance is obtained based on the voltages obtained twice and Thevenin's theorem. The insulation impedance may be obtained after the equation is solved. The insulation impedance is comprehensive impedance of the photovoltaic system to the ground. Therefore, it may be determined, based on the insulation impedance, whether there is an insulation fault in the photovoltaic system. When there is an insulation fault in the photovoltaic system, insulation impedance to the ground may be reduced. Therefore, the insulation impedance may be compared with a preset threshold. When the insulation impedance is less than the preset threshold, it indicates that there is an insulation fault in the photovoltaic system, and protection needs to be performed in a timely manner.

In a possible implementation, the controller may form an equation based on Thevenin's theorem, the voltage to ground of the bus that is before the switch is turned on, and the voltage to ground of the bus that is after the switch is turned on and may obtain the insulation impedance after solving the equation. When the insulation impedance is less than the preset threshold, it is determined that there is an insulation fault in the photovoltaic system, and insulation protection can be performed in a timely manner.

In a possible implementation, for ease of a hardware circuit, the insulation impedance detection circuit includes at least the switch and a resistor that are connected in series. A location relationship between the switch and the resistor that are connected in series is not limited in this embodiment. For example, the switch may be close to the ground, or the resistor may be close to the ground. Because resistance of the resistor in the insulation impedance detection circuit is a known value, the voltage to ground of the bus is detected once before the switch is turned on, and the voltage to ground of the bus is detected once after the switch is turned on. An equation of an equivalent circuit is formed based on Thevenin's theorem, where the resistance and the voltages detected twice are known values, so that an unknown value, that is, the insulation impedance, can be obtained after the equation is solved.

In a possible implementation, the electrical element includes at least one of the following: a resistor, a relay, an IGBT transistor, a MOS transistor, an inductor, or a diode.

In a possible implementation, to simplify a circuit and reduce circuit costs, the electrical element may be implemented by using a diode, that is, includes a first diode. An anode of the first diode is connected to the direct current negative bus, and a cathode of the first diode is connected to the neutral bus. In this way, a current path exists between the direct current negative bus and the neutral bus. Due to a unidirectional conduction feature of the diode, a current is unidirectional, and can flow from the direct current negative bus to the neutral bus but cannot flow from the neutral bus to the direct current negative bus.

In a possible implementation, the insulation impedance detection circuit is connected between the direct current positive bus and the ground, a first end of the insulation impedance detection circuit is connected to the direct current positive bus, a second end of the insulation impedance detection circuit is connected to the positive output end of the second DC/DC circuit, and both the first end and the second end of the insulation impedance detection circuit are grounded by using the switch and the resistor that are connected in series. The controller is configured to obtain the insulation impedance based on voltages to ground of the direct current positive bus that are separately corresponding to the switch before and after the switch is turned on and the resistor.

In a possible implementation, to avoid impact exerted by the direct current positive bus on the first input end of the negative voltage circuit, the insulation impedance detection circuit further includes a first isolation circuit. A first end of the first isolation circuit is connected to the second end of the insulation impedance detection circuit, and a second end of the first isolation circuit is grounded by using the resistor and the switch that are connected in series. The first isolation circuit includes at least one of the following: a resistor, a relay, an IGBT transistor, a MOS transistor, an inductor, or a diode.

In a possible implementation, the first isolation circuit includes a second diode. An anode of the second diode is connected to the second end of the insulation impedance detection circuit, and a cathode of the second diode is grounded by using the resistor and the switch that are connected in series. Due to a unidirectional conduction feature of the second diode, and because the cathode of the second diode is close to the direct current positive bus, a high voltage of the direct current positive bus is not applied to the first input end of the negative voltage circuit through the second diode.

In a possible implementation, to better isolate the direct current positive bus from the first input end of the negative voltage circuit, the insulation impedance detection circuit further includes a second isolation circuit. A first end of the second isolation circuit is connected to the first end of the insulation impedance detection circuit, and a second end of the second isolation circuit is grounded by using the resistor and the switch that are connected in series. The second isolation circuit includes at least one of the following: a resistor, a relay, an IGBT transistor, a MOS transistor, an inductor, or a diode.

In a possible implementation, to facilitate circuit implementation and reduce costs, the second isolation circuit further includes a third diode. An anode of the third diode is connected to the first end of the insulation impedance detection circuit, and a cathode of the third diode is grounded by using the resistor and the switch that are connected in series. Due to a unidirectional conduction feature of the third diode, and because the anode of the third diode is connected to the direct current positive bus, and the cathode of the third diode is close to the first input end of the negative voltage circuit, a voltage of the first input end of the negative voltage circuit does not affect the direct current positive bus.

The insulation impedance detection circuit provided in this embodiment may be connected not only between the direct current positive bus and the ground, but also between the direct current negative bus and the ground, or between the neutral bus and the ground. The obtained insulation impedance can represent an insulation status of the photovoltaic system.

In a possible implementation, the insulation impedance detection circuit is connected between the direct current negative bus and the ground, a first end of the insulation impedance detection circuit is connected to the direct current negative bus, and a second end of the insulation impedance detection circuit is grounded by using the switch and the resistor that are connected in series. The controller is configured to obtain the insulation impedance based on voltages to ground of the direct current negative bus that are separately corresponding to the switch before and after the switch is turned on and the resistor.

In a possible implementation, the insulation impedance detection circuit is connected between the neutral bus and the ground, a first end of the insulation impedance detection circuit is connected to the neutral bus, and a second end of the insulation impedance detection circuit is grounded by using the switch and the resistor that are connected in series. The controller is configured to obtain the insulation impedance based on voltages to ground of the neutral bus that are separately corresponding to the switch before and after the switch is turned on and the resistor.

In a possible implementation, the first DC/DC circuit, the second DC/DC circuit, the negative voltage circuit, and the insulation impedance detection circuit are integrated in a direct current combiner box.

In a possible implementation, the photovoltaic system further includes a first inverter and a second inverter. A first input end and a second input end of the first inverter are respectively configured to connect to the direct current positive bus and the neutral bus, and a first input end and a second input end of the second inverter are respectively configured to connect to the neutral bus and the direct current negative bus.

The photovoltaic system is used as an example above for description. The insulation impedance detection circuit provided in this embodiment may be further applied to another similar power supply system including three buses, for example, another new energy field, including wind power generation and water power generation, or may be applied to an energy storage system. Advantages corresponding to the foregoing solutions in the photovoltaic system are also applicable to the following power supply system. Details are not described herein again.

An embodiment may further provide a power supply system, including an insulation impedance detection circuit and a controller. The insulation impedance detection circuit is connected between a bus and the ground, and the bus includes a direct current positive bus, a neutral bus, or a direct current negative bus. The direct current positive bus and the neutral bus correspond to a first direct current power supply, and the neutral bus and the direct current negative bus correspond to a second direct current power supply. The insulation impedance detection circuit includes at least a switch. The direct current negative bus is connected to the neutral bus by using an electrical element or a voltage source. The controller is configured to: obtain insulation impedance based on voltages to ground of the bus that are separately corresponding to the switch before and after the switch is turned on, and detect, based on the insulation impedance, whether there is an insulation fault in the power supply system.

In a possible implementation, the power supply system further includes a first DC/DC circuit, a second DC/DC circuit, and a negative voltage circuit. An input end of the first DC/DC circuit is configured to connect to a first direct current power supply, and an input end of the second DC/DC circuit is configured to connect to a second direct current power supply. A positive output end and a negative output end of the first DC/DC circuit are respectively configured to connect to the direct current positive bus and the neutral bus, and a positive output end and a negative output end of the second DC/DC circuit are respectively connected to a first input end and a second input end of the negative voltage circuit, a first output end and a second output end of the negative voltage circuit are respectively configured to connect to the neutral bus and the direct current negative bus, and the negative output end of the second DC/DC circuit is configured to connect to the neutral bus.

In a possible implementation, the insulation impedance detection circuit is connected between the direct current positive bus and the ground, a first end of the insulation impedance detection circuit is connected to the direct current positive bus, a second end of the insulation impedance detection circuit is connected to the positive output end of the second DC/DC circuit, and both the first end and the second end of the insulation impedance detection circuit are grounded by using the switch and the resistor that are connected in series. The controller is configured to obtain the insulation impedance based on voltages to ground of the direct current positive bus that are separately corresponding to the switch before and after the switch is turned on and the resistor.

In a possible implementation, the insulation impedance detection circuit is connected between the direct current negative bus and the ground. A first end of the insulation impedance detection circuit is connected to the direct current negative bus, and a second end of the insulation impedance detection circuit is grounded by using the switch and a resistor that are connected in series. The controller is configured to obtain the insulation impedance based on voltages to ground of the direct current negative bus that are separately corresponding to the switch before and after the switch is turned on and the resistor.

In a possible implementation, the insulation impedance detection circuit is connected between the neutral bus and the ground. A first end of the insulation impedance detection circuit is connected to the neutral bus, and a second end of the insulation impedance detection circuit is grounded by using the switch and a resistor that are connected in series. The controller is configured to obtain the insulation impedance based on voltages to ground of the neutral bus that are separately corresponding to the switch before and after the switch is turned on and the resistor.

Based on the photovoltaic system and the direct current power supply provided in the foregoing embodiments, an embodiment may further provide an insulation fault detection method for a photovoltaic system. The photovoltaic system includes a first DC/DC circuit, a second DC/DC circuit, a negative voltage circuit, an insulation impedance detection circuit, and a controller. An input end of the first DC/DC circuit is configured to connect to a corresponding photovoltaic string, an input end of the second DC/DC circuit is configured to connect to a corresponding photovoltaic string, a positive output end and a negative output end of the first DC/DC circuit are respectively configured to connect to a direct current positive bus and a neutral bus, a positive output end and a negative output end of the second DC/DC circuit are respectively connected to a first input end and a second input end of the negative voltage circuit, a first output end and a second output end of the negative voltage circuit are respectively configured to connect to the neutral bus and the direct current negative bus, the negative output end of the second DC/DC circuit is configured to connect to the neutral bus, the insulation impedance detection circuit is connected between a bus and the ground, the bus includes the direct current positive bus, the neutral bus, or the direct current negative bus, the insulation impedance detection circuit includes at least a switch, and the direct current negative bus is connected to the neutral bus by using an electrical element or a voltage source.

The method includes: obtaining a voltage to ground of the bus that is before the switch is turned on; obtaining a voltage to ground of the bus that is after the switch is turned on; obtaining insulation impedance based on the voltage to ground of the bus that is before the switch is turned on and the voltage to ground of the bus that is after the switch is turned on; and detecting, based on the insulation impedance, whether there is an insulation fault in the photovoltaic system.

The embodiments may have at least the following advantages:

The photovoltaic system provided in the embodiments includes the direct current positive bus, the neutral bus, and the direct current negative bus. Therefore, an insulation status of the direct current positive bus and an insulation status of the direct current negative bus need to be detected, and an insulation status of a photovoltaic array also needs to be detected. However, a conventional insulation impedance detection circuit cannot comprehensively detect an insulation fault of such a multi-bus photovoltaic system provided in the embodiments. Therefore, to comprehensively detect the insulation fault in the photovoltaic system, the embodiments may provide an insulation fault detection manner. The insulation impedance detection circuit is connected between any one of three buses and the ground, where the three buses include the direct current positive bus L+, the neutral bus M, and the direct current negative bus L−, and the direct current negative bus L− may be connected to the neutral bus M by using an auxiliary circuit, that is, the direct current negative bus L− and the neutral bus M form a path, to ensure that the insulation impedance detection circuit can also detect an insulation status of the direct current negative bus L− to the ground. The auxiliary circuit includes at least an electrical element or a voltage source. The insulation impedance detection circuit includes at least a switch, and an insulation status of the photovoltaic system may be obtained based on voltages to ground of the bus that are separately corresponding to the switch before and after the switch is turned on. When there is an insulation fault in the direct current positive bus L+, the direct current negative bus L−, or a level-1 photovoltaic array, magnitude of the insulation impedance is affected. Therefore, the photovoltaic system provided in the embodiments can comprehensively detect the insulation fault.

DETAILED DESCRIPTION OF THE EMBODIMENTS

Terms "first", "second", and the like in the following descriptions are merely intended for a purpose of description and shall not be understood as an indication or implication of relative importance or an implicit indication of a quantity of indicated features. Therefore, a feature limited by "first" or "second" may explicitly or implicitly include one or more features. In the descriptions, unless otherwise stated, "a plurality of" means two or more.

In addition, orientation terms such as "up" and "down" may include but are not limited to orientations of schematically placed components in relative accompanying drawings. It should be understood that these orientation terms may be relative concepts. The orientation terms are used for relative description and clarification and may vary correspondingly based on a change in an orientation in which the component is placed in the accompanying drawings.

Unless otherwise specified and limited, the term "connection" should be understood in a broad sense. For example, the "connection" may be a fixed connection, a detachable connection, an integration, a direct connection, or an indirect connection by using an intermediate medium. In addition, the term "coupling" may be a manner of implementing an electrical connection for signal transmission. The "coupling" may be a direct electrical connection or may be an indirect electrical connection through an intermediate medium.

Embodiment of the Photovoltaic System

To make a person skilled in the art better understand the embodiments, a photovoltaic system provided in the embodiments may be described below.

Figure 1:
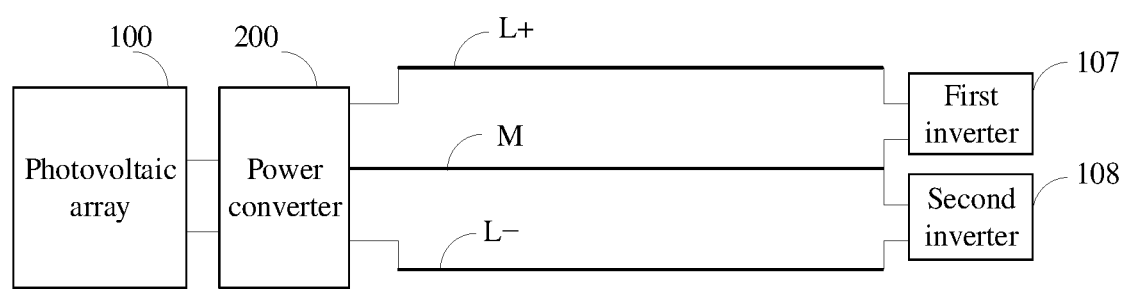
FIG. 1 is a schematic diagram of a photovoltaic system according to an embodiment.

FIG. 1 is a schematic diagram of a photovoltaic system according to an embodiment.

This embodiment relates to a photovoltaic system. A difference from a conventional unipolar photovoltaic system is that the photovoltaic system provided in this embodiment may include three buses: a direct current positive bus L+, a neutral bus M, and a direct current negative bus L−. The neutral bus M may be an open line, or may be a virtual potential, that is, a potential of a neutral bus M on a direct current side is consistent with a potential of a neutral bus M on an alternating current input end, and M on the direct current side and M on the alternating current input end do not necessarily need to be connected together by using an actually existing line. The photovoltaic system includes three direct current buses, that is, the direct current positive bus L+, the neutral bus M, and the direct current negative bus L−.

For example, if a voltage of L+ is +1500 V, and a voltage of L− is −1500 V, a voltage level of the photovoltaic system is ±1500 V. However, a voltage obtained after L+ and L− are connected in series is 3000 V. Therefore, the photovoltaic system provided in this embodiment may be applicable to a safety regulation of 1500 V, to reduce voltage withstand requirements for a power converter and a power tube in an inverter.

An input end of a power converter 200 is configured to connect to a photovoltaic array 100, a first output end of the power converter 200 is connected to a first end of the direct current positive bus L+, a second output end of the power converter 200 is connected to a first end of the neutral bus M, and a third output end of the power converter 200 is connected to a first end of the direct current negative bus L−.

In addition, the photovoltaic system provided in this embodiment may include at least two inverters: a first inverter 107 and a second inverter 108.

A first input end of the first inverter 107 is connected to a second end of the direct current positive bus L+, and a second input end of the first inverter 107 is connected to a second end of the neutral bus M.

A first input end of the second inverter 108 is connected to the second end of the neutral bus M, and a second input end of the second inverter 108 is connected to a second end of the direct current negative bus L−.

The photovoltaic system shown in FIG. 1 can reduce a voltage drop borne by a power component, and this facilitates product selection of the power component.

In actual working, a distance between the power converter and a lower-level inverter may be relatively long. Therefore, a loss on a power cable corresponding to a direct current bus is relatively large. Therefore, to improve power generation efficiency, the loss needs to be reduced as much as possible. A total voltage of a direct current bus corresponding to FIG. 1 is 3000 V. A higher voltage indicates a smaller corresponding current, so that a loss on the direct current bus can be reduced.

A schematic diagram of another photovoltaic system according to an embodiment is briefly described below with reference to FIG. 2.

Figure 2:
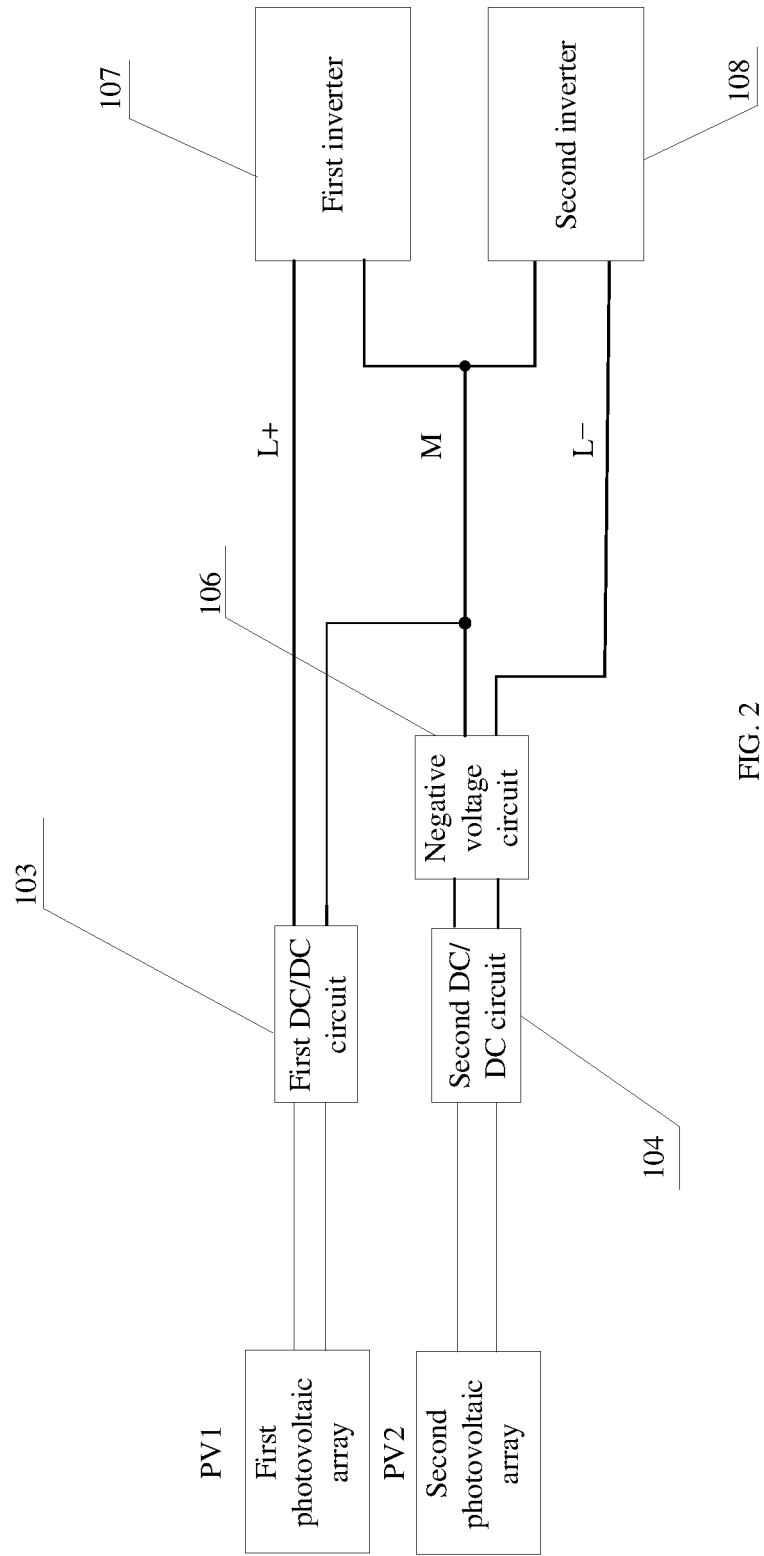
FIG. 2 is a schematic diagram of still another photovoltaic system according to an embodiment.

FIG. 2 is a schematic diagram of still another photovoltaic system according to an embodiment.

The photovoltaic system provided in this embodiment includes three buses: a direct current positive bus L+, a neutral bus M, and a direct current negative bus L−. Still as an example, there is 1500 V between the direct current positive bus L+ and the neutral bus M, and there is −1500 V between the direct current negative bus L− and the neutral bus M.

The photovoltaic system provided in this embodiment may include a first DC/DC circuit 103, a second DC/DC circuit 104, and a negative voltage circuit 106. An input end of the first DC/DC circuit 103 is configured to connect to a first photovoltaic array PV1, an output end of the first DC/DC circuit 103 is connected to the direct current positive bus L+ and the neutral bus M, an input end of the second DC/DC circuit 104 is configured to connect to a second photovoltaic array PV2, and an output end of the second DC/DC circuit 104 is connected to the neutral bus M and the direct current negative bus L−.

A voltage output by the photovoltaic array may be a positive voltage. Therefore, a voltage output by the second DC/DC circuit 104 is also a positive voltage. Therefore, the negative voltage circuit 106 needs to convert a positive voltage output by the second DC/DC circuit 104 into a negative voltage and provide the negative voltage for the neutral bus M and the direct current negative bus L−. For example, an implementation of the negative voltage circuit 106 may be a buck-boost circuit or may be another circuit topology. This is not limited in this embodiment.

In addition, a manner of connecting a first inverter 107 and a second inverter 108 to the three buses is the same as that in FIG. 1, and details are not described herein again.

The photovoltaic system provided in this embodiment may include the direct current positive bus, the neutral bus, and the direct current negative bus. Therefore, an insulation status of the direct current positive bus and an insulation status of the direct current negative bus need to be detected, and an insulation status of the photovoltaic array also needs to be detected. However, a conventional insulation impedance detection circuit cannot comprehensively detect an insulation fault of such a multi-bus photovoltaic system provided in this embodiment. Therefore, to comprehensively detect an insulation fault in the photovoltaic system, this embodiment may provide an insulation fault detection manner. An insulation impedance detection circuit is connected between any one of three buses and the ground, where the three buses include the direct current positive bus L+, the neutral bus M, and the direct current negative bus L−, and the direct current negative bus L− may be connected to the neutral bus M by using an auxiliary circuit, that is, the direct current negative bus L− and the neutral bus M form a path, to ensure that the insulation impedance detection circuit can also detect an insulation status of the direct current negative bus L− to the ground. The auxiliary circuit includes at least an electrical element or a voltage source. The insulation impedance detection circuit includes at least a switch, and an insulation status of the photovoltaic system may be obtained based on voltages to ground of the bus that are separately corresponding to the switch before and after the switch is turned on. When there is an insulation fault in the direct current positive bus L+, the direct current negative bus L−, or a level-1 photovoltaic array, magnitude of insulation impedance is affected. Therefore, the photovoltaic system provided in this embodiment of can comprehensively detect the insulation fault.

The following still uses an example in which a photovoltaic system includes two DC/DC circuits and a negative voltage circuit for description.

Figure 3:
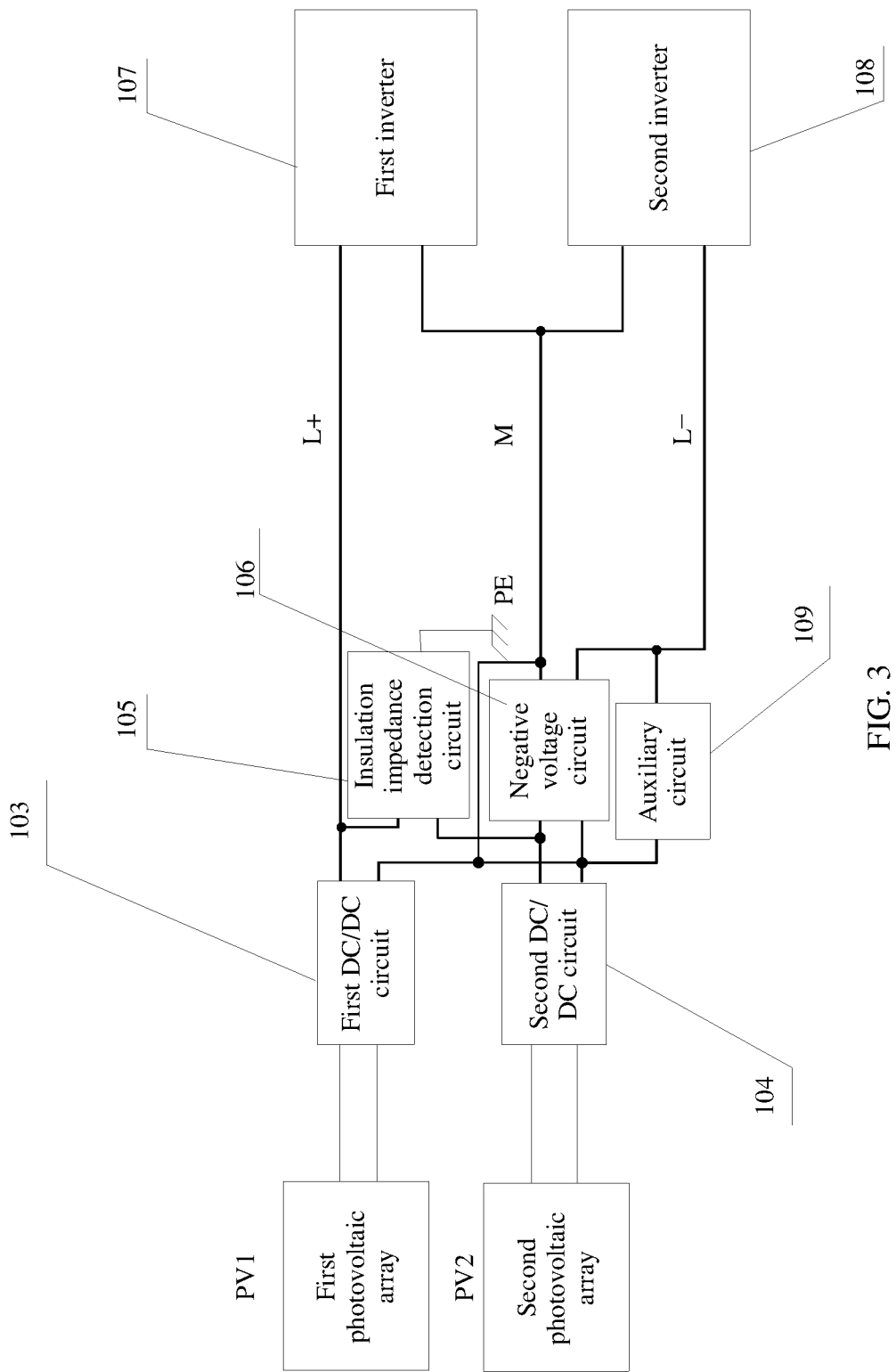
FIG. 3 is a schematic diagram of another photovoltaic system according to an embodiment.

FIG. 3 is a schematic diagram of another photovoltaic system according to an embodiment.

The photovoltaic system provided in this embodiment may include a first DC/DC circuit 103, a second DC/DC circuit 104, a negative voltage circuit 106, an insulation impedance detection circuit 105, and a controller (not shown in the figure).

An input end of the first DC/DC circuit 103 is configured to connect to a corresponding photovoltaic string, and an input end of the second DC/DC circuit 104 is configured to connect to a corresponding photovoltaic string.

A positive output end and a negative output end of the first DC/DC circuit 103 are respectively configured to connect to a direct current positive bus L+ and a neutral bus M.

A positive output end and a negative output end of the second DC/DC circuit 104 are respectively connected to a first input end and a second input end of the negative voltage circuit 106, a first output end and a second output end of the negative voltage circuit 106 are respectively configured to connect to the neutral bus M and a direct current negative bus L−, and the negative output end of the second DC/DC circuit 104 is configured to connect to the neutral bus M.

The insulation impedance detection circuit 105 is connected between a bus and the ground, and the bus includes at least one of the following: the direct current positive bus L+, the neutral bus M, or the direct current negative bus L−. The insulation impedance detection circuit 105 includes at least a switch. The direct current negative bus L− is connected to the neutral bus M by using an electrical element or a voltage source.

In this embodiment, an implementation of the switch in the insulation impedance detection circuit 105 is not limited. For example, the switch may be a relay, or may be another switch component that can control on/off of the switch. A status of the switch may be controlled by the controller; in other words, the controller controls on/off of the switch.

The controller is configured to: obtain insulation impedance based on voltages to ground of the bus that are separately corresponding to the switch before and after the switch is turned on, and determine, based on the insulation impedance, whether there is an insulation fault in the photovoltaic system.

In FIG. 3, for example, the insulation impedance detection circuit 105 is connected between the direct current positive bus L+ and the ground PE. Therefore, voltages to ground of the direct current positive bus L+ that are before and after the switch in the insulation impedance detection circuit 105 is turned on may be obtained to obtain the insulation impedance.

An auxiliary circuit 109 is configured to connect the direct current negative bus L− to the neutral bus M. Even if a conduction path is formed between the direct current negative bus L− and PV− or the neutral bus M, it should be noted that the conduction path is formed herein, but a potential of the direct current negative bus L− and a potential of the neutral bus M are not consistent, and there is a potential difference between the direct current negative bus L− and the neutral bus M.

The auxiliary circuit 109 may include at least the electrical element or the voltage source. For example, the electrical element may include at least any one of the following: a resistor, a relay, an IGBT transistor, a MOS transistor, an inductor, or a diode. For example, the electrical element may include a diode. An anode of the diode is connected to the direct current negative bus L−, and a cathode of the diode may be connected to the neutral bus M. In other words, the direct current negative bus L− may form a conduction path to the neutral bus M, so that insulation impedance of the direct current negative bus L− to the ground is equivalent to insulation impedance of the neutral bus to the ground by using the diode.

In this embodiment, a location of the insulation impedance detection circuit 105 is not limited. For example, when the photovoltaic system includes a direct current combiner box, the insulation impedance detection circuit 105 may be located in the direct current combiner box.

The photovoltaic system provided in this embodiment may include the insulation impedance detection circuit. The insulation impedance detection circuit may be connected between any one of the three buses and the ground. To comprehensively detect the insulation impedance of the photovoltaic system, the direct current negative bus is equivalent to the neutral bus; in other words, the direct current negative bus is connected to the neutral bus by using the voltage source or the electrical element, to form a conduction path between the direct current negative bus and the neutral bus. Because the insulation impedance detection circuit includes the switch, a voltage to ground of the bus connected to the insulation impedance detection circuit is obtained once before the switch is turned on, and a voltage to ground of the bus connected to the insulation impedance detection circuit is obtained once after the switch is turned on. An equation including a voltage and a resistance is obtained based on the voltages obtained twice and Thevenin's theorem. The insulation impedance may be obtained after the equation is solved. The insulation impedance is comprehensive impedance of the photovoltaic system to the ground. Therefore, it may be determined, based on the insulation impedance, whether there is an insulation fault in the photovoltaic system. When there is an insulation fault in the photovoltaic system, insulation impedance to the ground may be reduced. Therefore, the insulation impedance may be compared with a preset threshold. When the insulation impedance is less than the preset threshold, it indicates that there is an insulation fault in the photovoltaic system, and protection needs to be performed in a timely manner.

Figure 4:
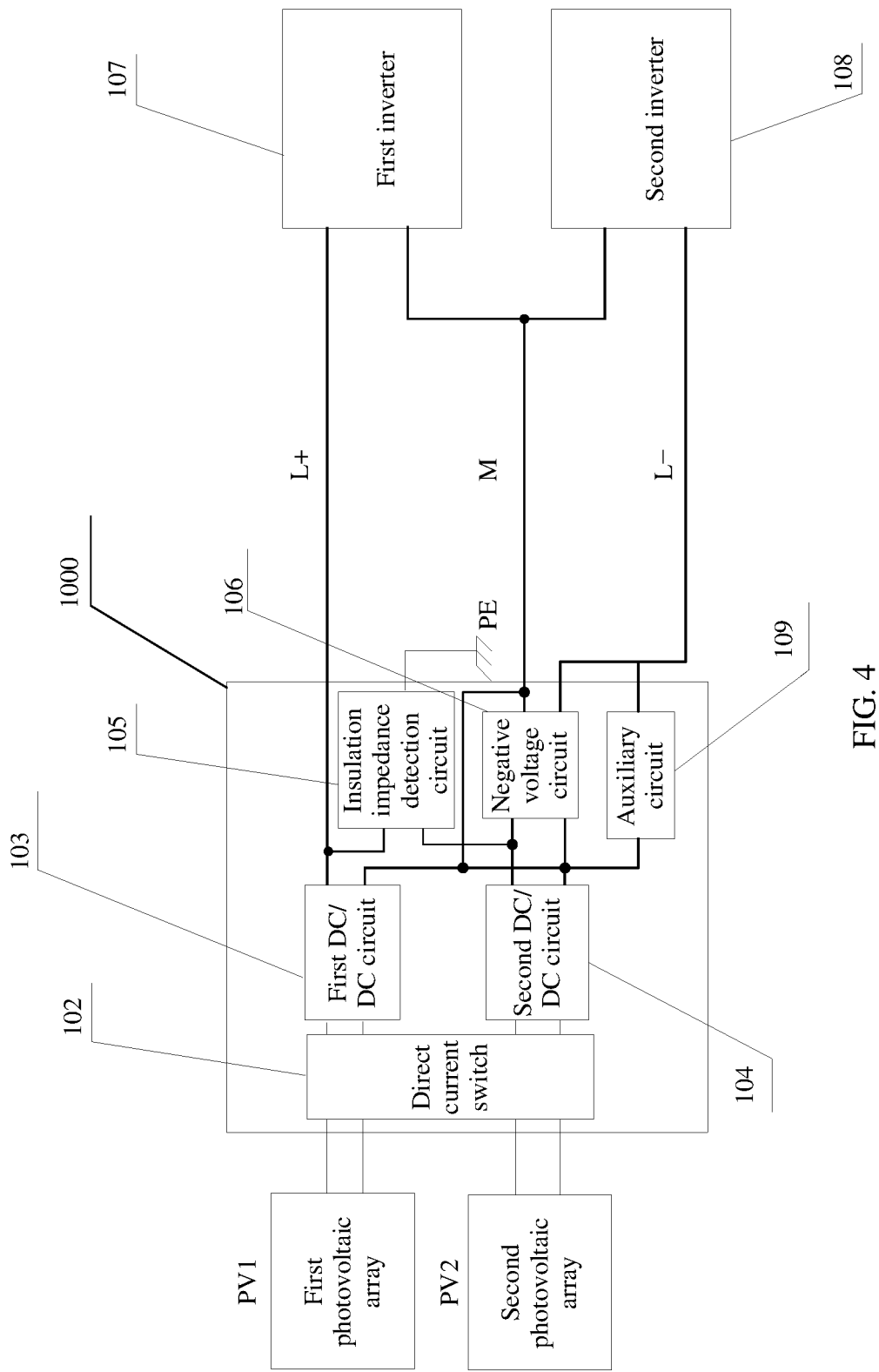
FIG. 4 is a schematic diagram of yet another photovoltaic system according to an embodiment.

FIG. 4 is a schematic diagram of yet another photovoltaic system according to an embodiment.

The photovoltaic system provided in this embodiment includes a direct current combiner box 1000, and further includes a direct current switch 102. The first DC/DC circuit 103 and the second DC/DC circuit 104 are respectively connected to a first photovoltaic array PV1 and a second photovoltaic array PV2 by using the direct current switch 102. The direct current switch 102 may be turned off when necessary. For example, when there is a fault in the photovoltaic system, the direct current switch 102 is turned off, to disconnect the photovoltaic array from the DC/DC circuit, thereby achieving a protection function. An implementation form of the direct current switch 102 is not limited in this embodiment. For example, the direct current switch 102 may be a relay, or may be a switch of another type.

For ease of control, the controller may alternatively be located in the direct current combiner box 1000. The controller may control work of the first DC/DC circuit 103, the second DC/DC circuit 104, and the negative voltage circuit 106.

To enable a person skilled in the art to better understand a principle of detecting an insulation fault in a photovoltaic system provided in this embodiment, detailed descriptions are provided below with reference to FIG. 5. In the following embodiments, as an example for description, the first DC/DC circuit 103 and the second DC/DC circuit 104 are boost circuits. It should be understood that the first DC/DC circuit 103 and the second DC/DC circuit 104 may alternatively be direct current conversion circuits in another form. This is not limited in this embodiment.

Figure 5:
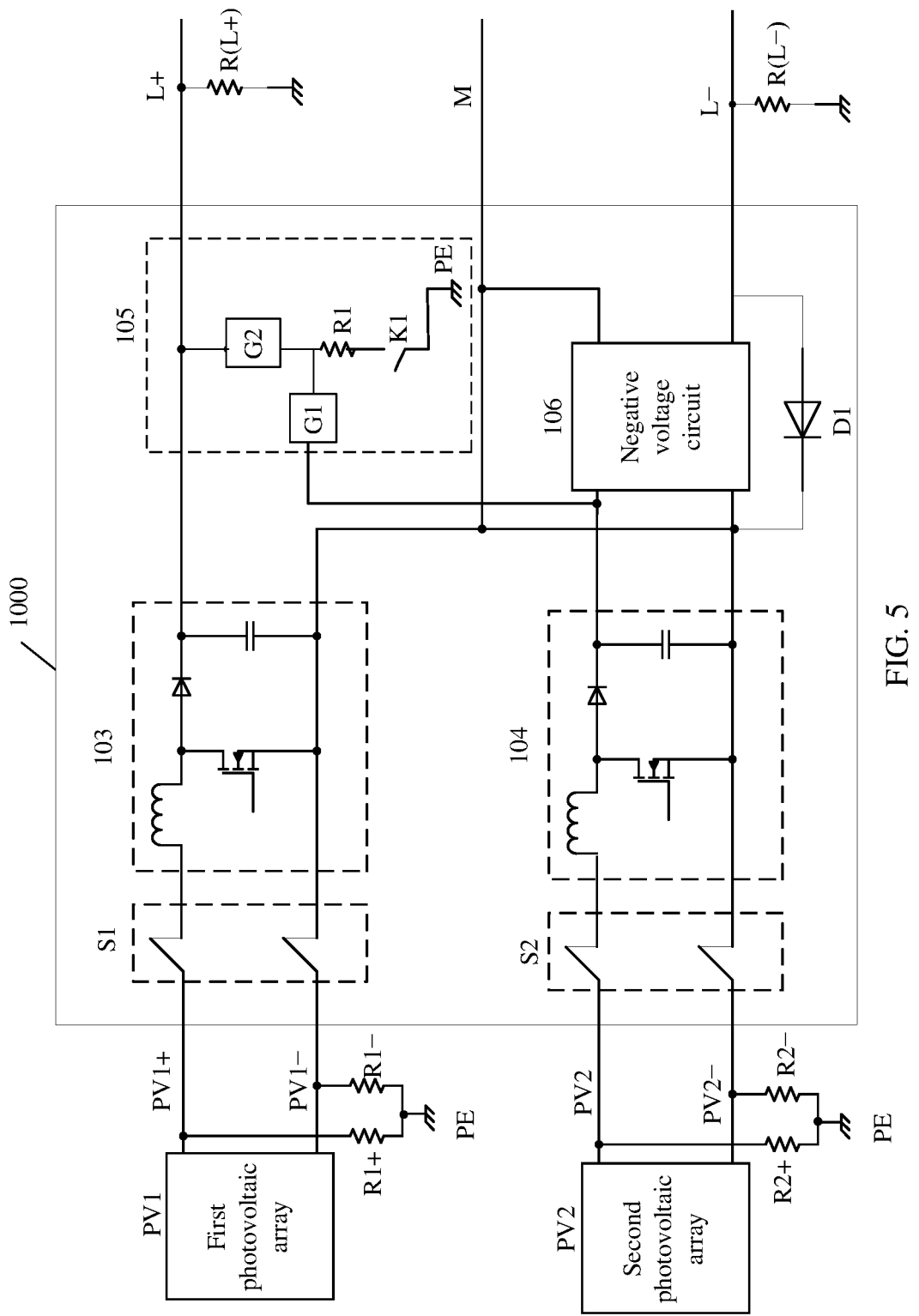
FIG. 5 is a schematic diagram of still another photovoltaic system according to an embodiment.

FIG. 5 is a schematic diagram of yet another photovoltaic system according to an embodiment.

In the photovoltaic system provided in this embodiment, the direct current negative bus L− is connected to the neutral bus M by using an electrical element. In other words, an example in which the auxiliary circuit includes the electrical element is used. For ease of description and to simplify a circuit structure and reduce costs of the entire photovoltaic system, a first diode D1 may be selected as the electrical element.

An anode of the first diode D1 is connected to the direct current negative bus, and a cathode of the first diode D1 is connected to the neutral bus M.

The insulation impedance detection circuit 105 is connected between the direct current positive bus L+ and the ground PE.

A first end of the insulation impedance detection circuit 105 is connected to the direct current positive bus L+, a second end of the insulation impedance detection circuit 105 is connected to a positive output end of the second DC/DC circuit 104, and both the first end and the second end of the insulation impedance detection circuit 105 are grounded by using a switch K1 and a resistor R1 that are connected in series. In this embodiment, a location relationship between the switch K1 and the resistor R1 that are connected in series is not limited. For example, the switch K1 may be close to the ground PE, or the resistor R1 may be close to the ground PE.

The controller is configured to obtain insulation impedance based on a resistance and voltages to ground PE of the direct current positive bus L+ that are separately corresponding to the switch K1 before and after the switch K1 is turned on, that is, two voltages.

For example, when the switch K1 is turned off, that is, before the switch K1 is turned on, the direct current positive bus L+ is not grounded to the PE by using the switch K1 and the resistor R1, that is, a branch including R1 and K1 that are connected in series is not turned on. In this case, a voltage between the direct current positive bus L+ and the PE is obtained. After the switch K1 is turned on, that is, the branch including R1 and K1 that are connected in series is turned on, the direct current positive bus L+ is grounded to the PE by using the switch K1 and the resistor R1. In this case, the voltage between the direct current positive bus L+ and the PE is obtained. Before the switch K1 is turned on and after the switch K1 is turned on, impedance of the direct current positive bus L+ to the ground changes. Because the resistor R1 is connected to a system after the K1 is turned on, impedance of L+ to the ground is affected. In addition, because R1 is known, the insulation impedance of the photovoltaic system may be obtained by using an equation, to determine whether there is an insulation fault in the photovoltaic system. For example, when the obtained insulation impedance is less than a preset threshold, it indicates that there is an insulation fault in the photovoltaic system, and an inverter with the insulation fault needs to be shut down, to avoid expansion of a range of the insulation fault.

To avoid impact exerted by the direct current positive bus L+ on the first input end of the negative voltage circuit 106, the insulation impedance detection circuit 105 provided in this embodiment may further include a first isolation circuit G1.

A first end of the first isolation circuit G1 is connected to the second end of the insulation impedance detection circuit 105, and a second end of the first isolation circuit G1 is grounded by using the resistor R and the switch K1 that are connected in series.

An implementation form of the first isolation circuit G1 is not limited in this embodiment, provided that the direct current positive bus L+ can be isolated from the first input end of the negative voltage circuit 106. For example, the first isolation circuit G1 may include at least one of the following: a resistor, a relay, an insulated gate bipolar transistor (IGBT), a metal-oxide semiconductor field-effect transistor (MOS), an inductor, or a diode.

In addition, to better isolate the direct current positive bus L+ from the first input end of the negative voltage circuit 106, the insulation impedance detection circuit 105 may further include a second isolation circuit G2.

A first end of the second isolation circuit G2 is connected to the first end of the insulation impedance detection circuit 105, and a second end of the second isolation circuit G2 is grounded by using the resistor and the switch that are connected in series.

Similar to the first isolation circuit G1, an implementation of the second isolation circuit G2 is not limited in this embodiment either. For example, the second isolation circuit G2 may include at least one of the following: a resistor, a relay, an IGBT transistor, a MOS transistor, an inductor, or a diode.

This embodiment is described by using an example in which the direct current switch includes a first direct current switch S1 and a second direct current switch S2. The first DC/DC circuit 103 is connected to the first photovoltaic array PV1 by using the first direct current switch S1, and the second DC/DC circuit 104 is connected to the second photovoltaic array PV2 by using the second direct current switch S2.

Figure 6:
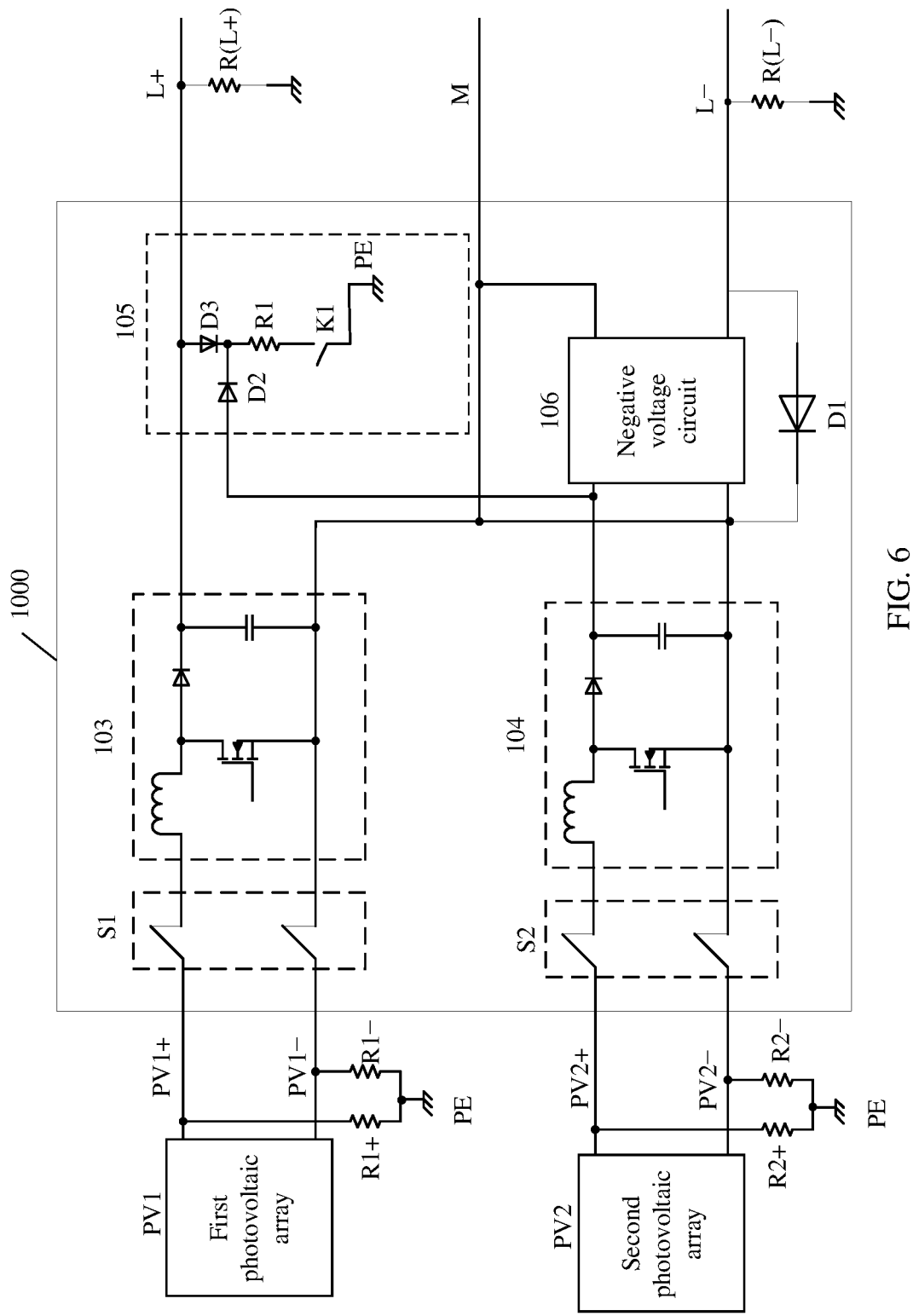
FIG. 6 is a schematic diagram of still another photovoltaic system according to an embodiment.

FIG. 6 is a schematic diagram of still another photovoltaic system according to an embodiment.

In this embodiment, implementations of the first isolation circuit and the second isolation circuit may be described. For convenience and simplicity and to reduce circuit costs, in a possible implementation, the first isolation circuit G1 may include a second diode D2.

An anode of the second diode D2 is connected to the second end of the insulation impedance detection circuit 105, and a cathode of the second diode D2 is grounded by using the resistor R1 and the switch K1 that are connected in series.

Due to a unidirectional conduction feature of the second diode D2, and because the cathode of the second diode D2 is close to the direct current positive bus L+, a high voltage of the direct current positive bus L+ is not applied to the first input end of the negative voltage circuit 106 through the second diode D2.

To facilitate circuit implementation and reduce costs, the second isolation circuit G2 may include a third diode D3.

An anode of the third diode D3 is connected to the first end of the insulation impedance detection circuit 105, and a cathode of the third diode D3 is grounded by using the resistor R1 and the switch K1 that are connected in series.

Due to a unidirectional conduction feature of the third diode D3, and because the anode of the third diode D3 is connected to the direct current positive bus L+ and the cathode of the third diode D3 is close to the first input end of the negative voltage circuit 106, a voltage of the first input end of the negative voltage circuit 106 does not affect the direct current positive bus L+.

In conclusion, in this embodiment, bidirectional isolation between the first input end of the negative voltage circuit 106 and the direct current positive bus L+ is implemented by using the second diode D2 and the third diode D3, so that the first input end of the negative voltage circuit 106 and the direct current positive bus L+ do not affect each other.

A manner of detecting the insulation impedance may be analyzed below with reference to FIG. 7 and FIG. 8.

Figure 7:
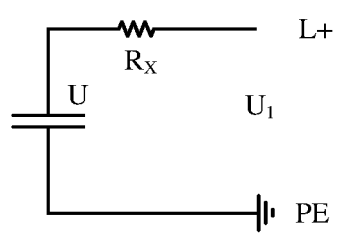
FIG. 7 is a diagram of a Thevenin equivalent circuit obtained when a switch is turned off according to an embodiment.

FIG. 7 is a diagram of a Thevenin equivalent circuit obtained when a switch is turned off according to an embodiment.

In the insulation impedance detection circuit provided in this embodiment, when the switch in the insulation impedance detection circuit is turned off, the direct current positive bus L+ to the ground PE may be equivalent to a circuit in FIG. 7 by using Thevenin's theorem.

The direct current positive bus L+ may be equivalent to a voltage source and impedance that are connected in series, U represents an equivalent voltage source, Rx represents equivalent impedance of the photovoltaic system to the ground PE, and U1 represents a voltage to ground of the direct current positive bus L+.

Figure 8:
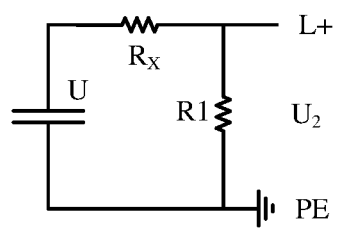
FIG. 8 is a diagram of a Thevenin equivalent circuit obtained when a switch is turned on according to an embodiment.

FIG. 8 is a diagram of a Thevenin equivalent circuit obtained when a switch is turned on according to an embodiment.

Corresponding to FIG. 7, FIG. 8 is a diagram of an equivalent circuit obtained when the switch K1 in FIG. 6 is turned on. When the switch K1 is turned on, the resistor R1 is connected to a circuit; in other words, the direct current positive bus L+ is grounded by using the resistor R1.

An equation is formed below with reference to FIG. 7 and FIG. 8 to obtain Rx.

First, in the circuit shown in FIG. 7, because the direct current positive bus L+ is disconnected from the PE, U=U1.

In the circuit shown in FIG. 8, U=Ux+U2, where Ux=Rx*I, U2=R1*I, and I is a current flowing through R1 and Rx.

Therefore, Rx=[(U1−U2)*R1]/U2 may be obtained by using the foregoing formulas.

Because a value of R1 is known, U1 and U2 may be obtained through detection. Therefore, a value of Rx may be obtained. The value of Rx is compared with a preset threshold, and when Rx is less than the preset threshold, it indicates that there is an insulation fault in the photovoltaic system. Rx is a parallel value of insulation impedance of PV+ and PV− on the side of the photovoltaic array to the PE and insulation impedance of the direct current positive bus L+ and the direct current negative bus L− to the PE. Therefore, in the photovoltaic system provided in this embodiment, when it is detected that there is an insulation fault in the photovoltaic system, the insulation fault may be an insulation fault of the direct current positive bus L+, an insulation fault of the direct current negative bus L− to the ground, or an insulation fault of the side of the photovoltaic array to the ground.

It should be understood that U1 and U2 may be obtained by using a voltage detection circuit. A voltage detection circuit for a bus voltage is disposed in the photovoltaic system.

That the insulation impedance detection circuit is connected between the direct current positive bus and the ground is described in the foregoing embodiment. A case in which the insulation impedance detection circuit is connected between the neutral bus and the ground is described below with reference to the accompanying drawings.

Figure 9:
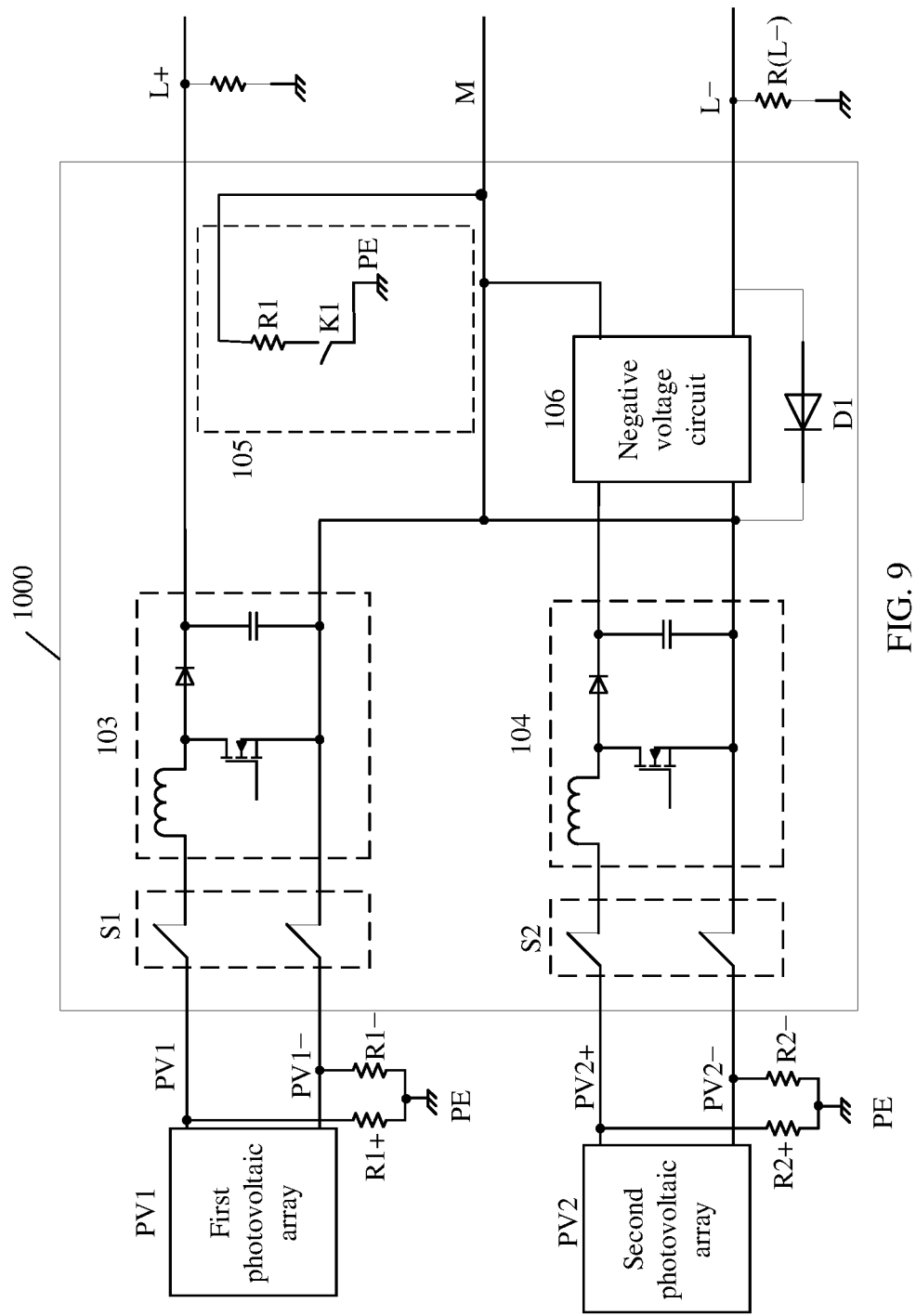
FIG. 9 is a schematic diagram of still another photovoltaic system according to an embodiment.

FIG. 9 is a schematic diagram of still another photovoltaic system according to an embodiment.

An insulation impedance detection circuit 105 in the photovoltaic system provided in this embodiment may be connected between the neutral bus M and the ground PE. Similar to the foregoing embodiments, the insulation impedance detection circuit 105 includes the resistor R1 and the switch K1 that are connected in series.

The controller may obtain the insulation impedance of the photovoltaic system based on the resistor R1 and voltages to ground of the neutral bus M that are separately corresponding to the switch K1 before and after the switch K1 is turned on. It should be understood that when the insulation impedance detection circuit is connected between the neutral bus M and the ground PE, a manner of obtaining the insulation impedance may still use Thevenin's theorem. Refer to the foregoing descriptions in FIG. 7 and FIG. 8. Details are not described herein again. After obtaining the insulation impedance, the controller may determine, based on the insulation impedance, whether there is an insulation fault in the photovoltaic system. When the obtained insulation impedance is less than the preset threshold, it indicates that there is an insulation fault in the photovoltaic system. In this case, the controller may control both a first direct current switch S1 and a second direct current switch S2 to be turned off, to disconnect the photovoltaic array from the DC/DC circuit. In addition, the controller may also control the two DC/DC circuits to stop working, and control two connected lower-level inverters to be shut down.

A case in which the insulation impedance detection circuit is connected between the neutral bus and the ground is described in FIG. 9. A case in which the insulation impedance detection circuit is connected between the direct current negative bus and the ground is described below with reference to FIG. 10.

Figure 10:
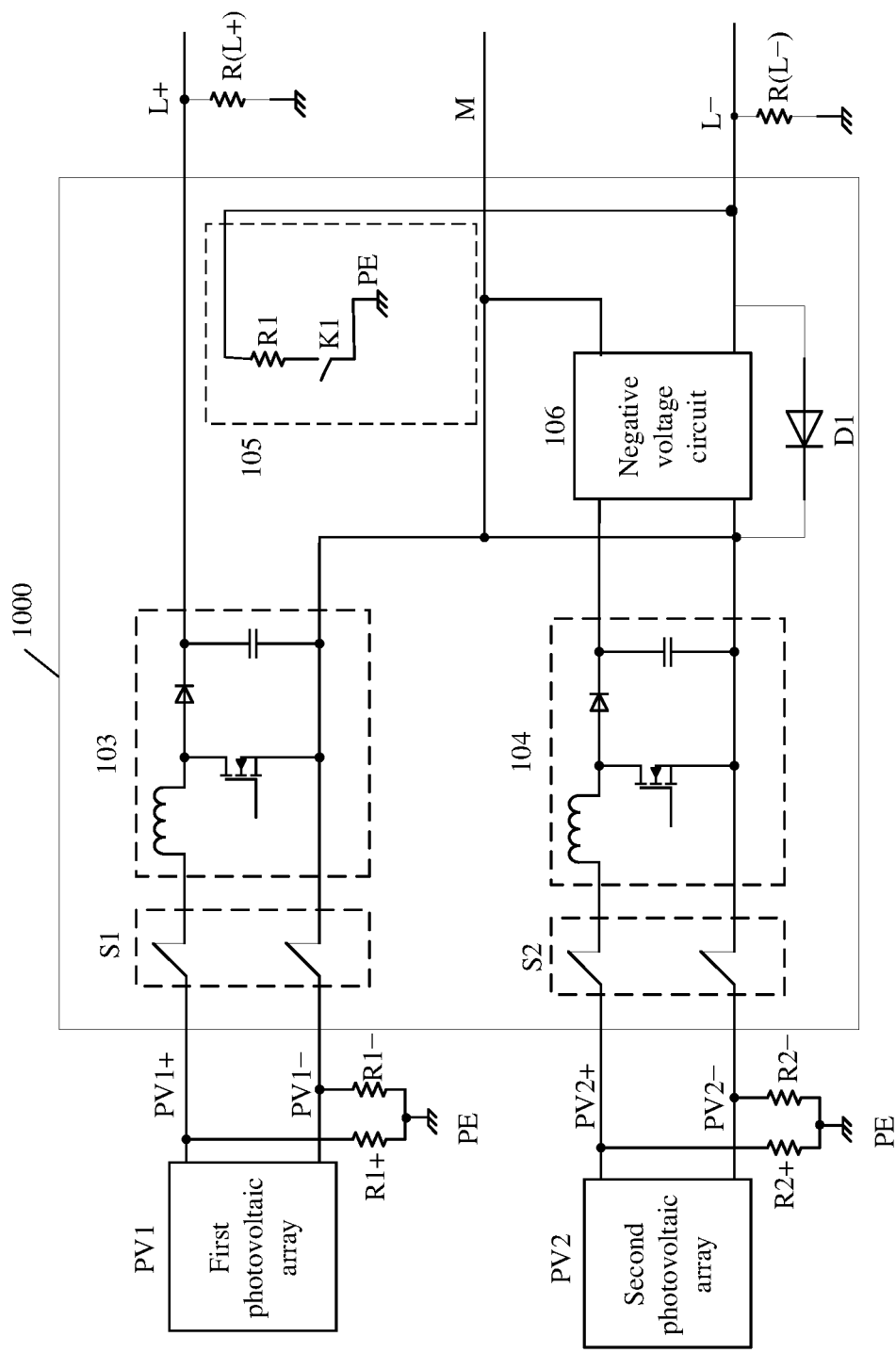
FIG. 10 is a schematic diagram of yet another photovoltaic system according to an embodiment.

FIG. 10 is a schematic diagram of yet another photovoltaic system according to an embodiment.

An insulation impedance detection circuit 105 in the photovoltaic system provided in this embodiment may be connected between the direct current negative bus L– and the ground PE. Similar to the foregoing embodiments, the insulation impedance detection circuit 105 includes the resistor R1 and the switch K1 that are connected in series.

The controller may obtain the insulation impedance of the photovoltaic system based on the resistor R1 and voltages to ground of the direct current negative bus L– that are separately corresponding to the switch K1 before and after the switch K1 is turned on. It should be understood that, when the insulation impedance detection circuit is connected between the direct current negative bus L– and the ground PE, a manner of obtaining the insulation impedance may still use Thevenin's theorem. Refer to the foregoing descriptions in FIG. 7 and FIG. 8. Details are not described herein again. After obtaining the insulation impedance, the controller may determine, based on the insulation impedance, whether there is an insulation fault in the photovoltaic system. When the obtained insulation impedance is less than the preset threshold, it indicates that there is an insulation fault in the photovoltaic system. In this case, the controller may control both a first direct current switch S1 and a second direct current switch S2 to be turned off, to disconnect the photovoltaic array from the DC/DC circuit. In addition, the controller may also control the two DC/DC circuits to stop working, and control two connected lower-level inverters to be shut down.

Figure 11:
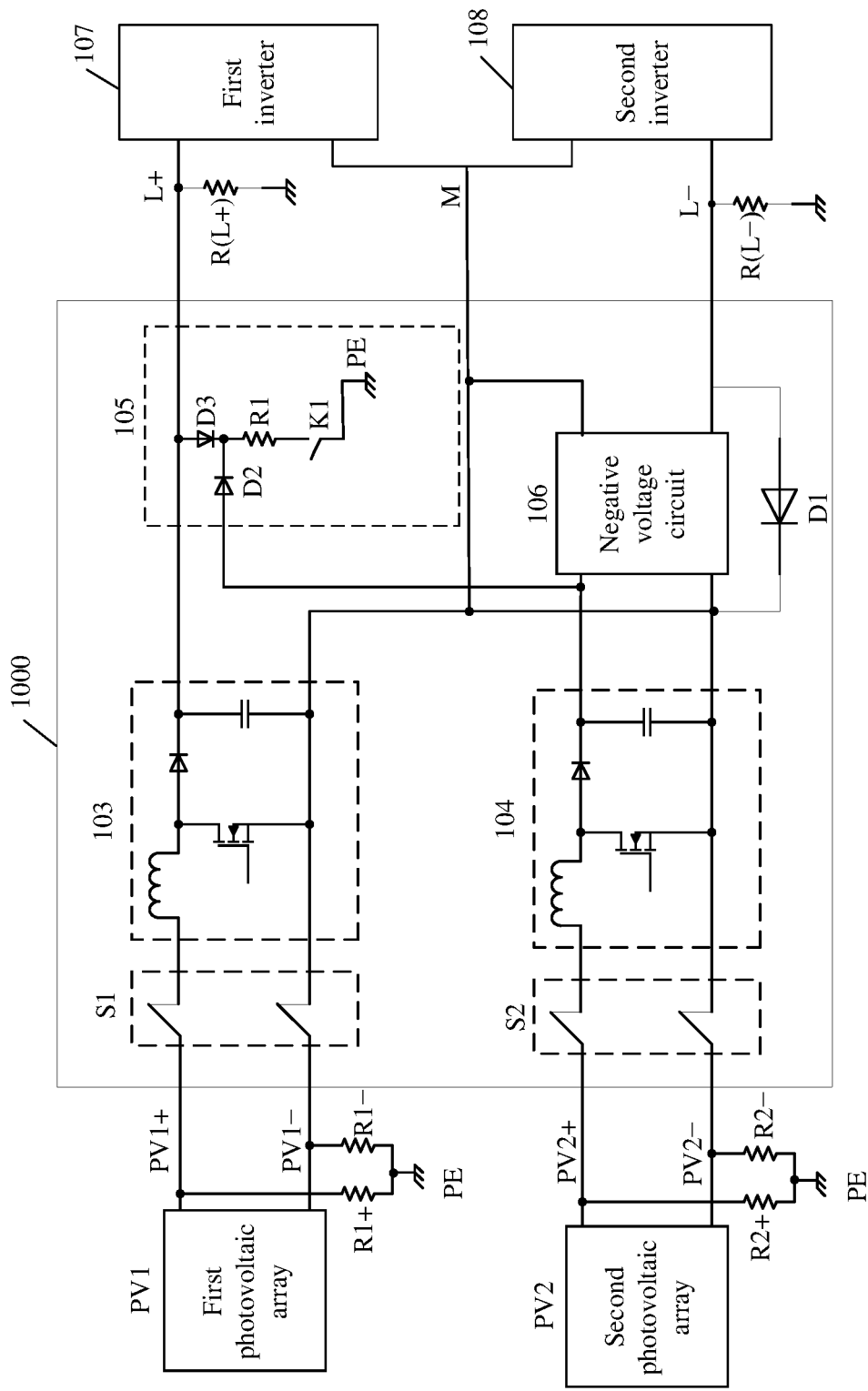
FIG. 11 is a schematic diagram of another photovoltaic system according to an embodiment.

Cases in which the three buses are respectively connected to the insulation impedance detection circuit are described above. It should be understood that the three buses are correspondingly connected to two inverters. An example in which the direct current positive bus L+ is connected to the insulation impedance detection circuit 105 may be used. FIG. 11 is a schematic diagram of another photovoltaic system according to an embodiment.

The photovoltaic system provided in this embodiment may further include a first inverter 107 and a second inverter 108.

A first input end and a second input end of the first inverter 107 are respectively configured to connect to the direct current positive bus L+ and the neutral bus M.

A first input end and a second input end of the second inverter 108 are respectively configured to connect to the neutral bus M and the direct current negative bus L–.

For example, a voltage at the input end of the first inverter 107 is 0 V to 1500 V, a voltage at the input end of the second inverter 108 is –1500 V to 0 V, and a voltage level of the entire photovoltaic system is 3000 V.

Embodiment of Power Supply System

Based on the photovoltaic system provided in the foregoing embodiments, an embodiment may further provide a power supply system. A difference between the power supply system and the foregoing photovoltaic system is merely that a type of a direct current power supply is not limited. For example, the direct current power supply may be any new energy, for example, a photovoltaic array, may be a direct current power supply generated through wind power generation, may be a direct current power supply generated through water power generation, or may be a direct current power supply generated by an energy storage battery, provided that the power supply system includes three buses, to form a positive voltage and a negative voltage.

Figure 12:
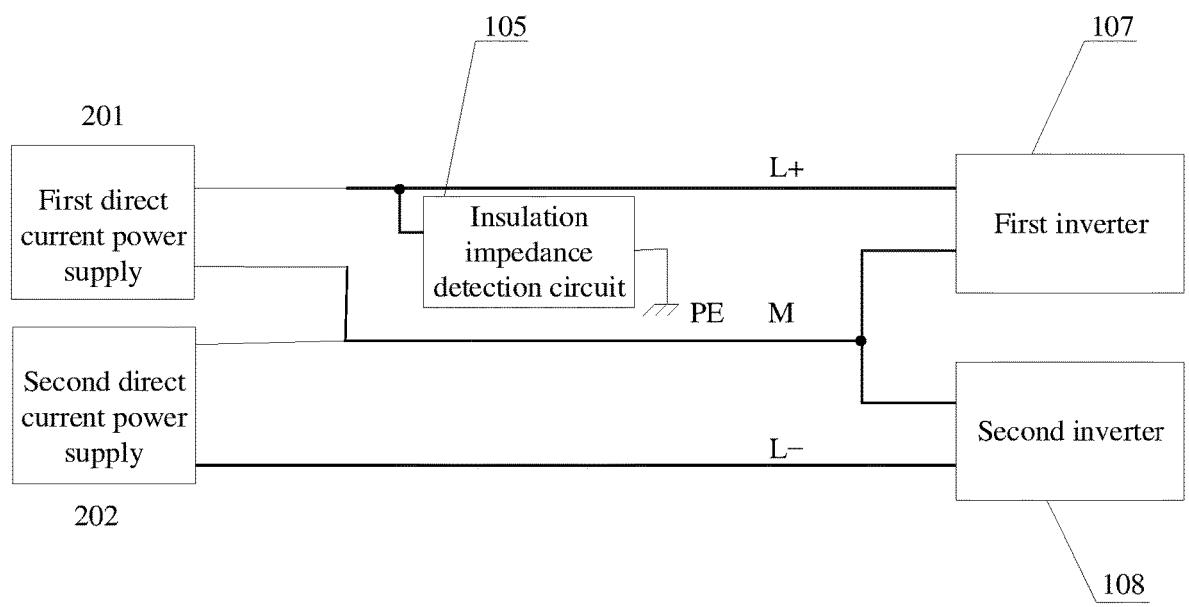
FIG. 12 is a schematic diagram of a power supply system according to an embodiment.

FIG. 12 is a schematic diagram of a power supply system according to an embodiment.

The power supply system provided in this embodiment includes an insulation impedance detection circuit 105 and a controller (not shown in the figure).

The insulation impedance detection circuit 105 is connected between a bus and the ground, and the bus includes a direct current positive bus L+, a neutral bus M, or a direct current negative bus L–. The direct current positive bus L+ and the neutral bus correspond to a first direct current power supply 201, and the neutral bus M and the direct current negative bus L– correspond to a second direct current power supply 202.

FIG. 12 is described by using an example in which the insulation impedance detection circuit 105 is connected between the direct current positive bus L+ and the ground PE.

The insulation impedance detection circuit 105 includes at least a switch. The direct current negative bus L– is connected to the neutral bus M by using an electrical element or a voltage source; in other words, there is a potential difference between the direct current negative bus L– and the neutral bus M. An auxiliary circuit 109 is configured to connect the direct current negative bus L– to the neutral bus M. Even if a conduction path is formed between the direct current negative bus L– and PV– or the neutral bus M, it should be noted that the conduction path is formed herein, but a potential of the direct current negative bus L– and a potential of the neutral bus M are not consistent, and there is a potential difference between the direct current negative bus L− and the neutral bus M. For example, L− and M may be connected by using the auxiliary circuit. For example, the auxiliary circuit may include at least an electrical element or a voltage source. For example, the electrical element may include at least any one of the following: a resistor, a relay, an IGBT transistor, a MOS transistor, an inductor, or a diode. For example, the electrical element may include a diode. An anode of the diode is connected to the direct current negative bus L−, and a cathode of the diode may be connected to the neutral bus M. In other words, the direct current negative bus L− may form a conduction path to the neutral bus M, so that insulation impedance of the direct current negative bus L− to the ground is equivalent to insulation impedance of the neutral bus to the ground by using the diode.

In this embodiment, an implementation of the switch in the insulation impedance detection circuit 105 is not limited. For example, the switch may be a relay, or may be another switch component that can control on/off of the switch. A status of the switch may be controlled by the controller; in other words, the controller controls on/off of the switch.

The controller is configured to obtain insulation impedance based on voltages to ground of the bus that are separately corresponding to the switch before and after the switch is turned on. When the insulation impedance is less than a preset threshold, it indicates that there is an insulation fault in the power supply system. For a manner of obtaining the insulation impedance by the controller, refer to the descriptions in the embodiment of the photovoltaic system. Details are not described herein again.

Figure 13:
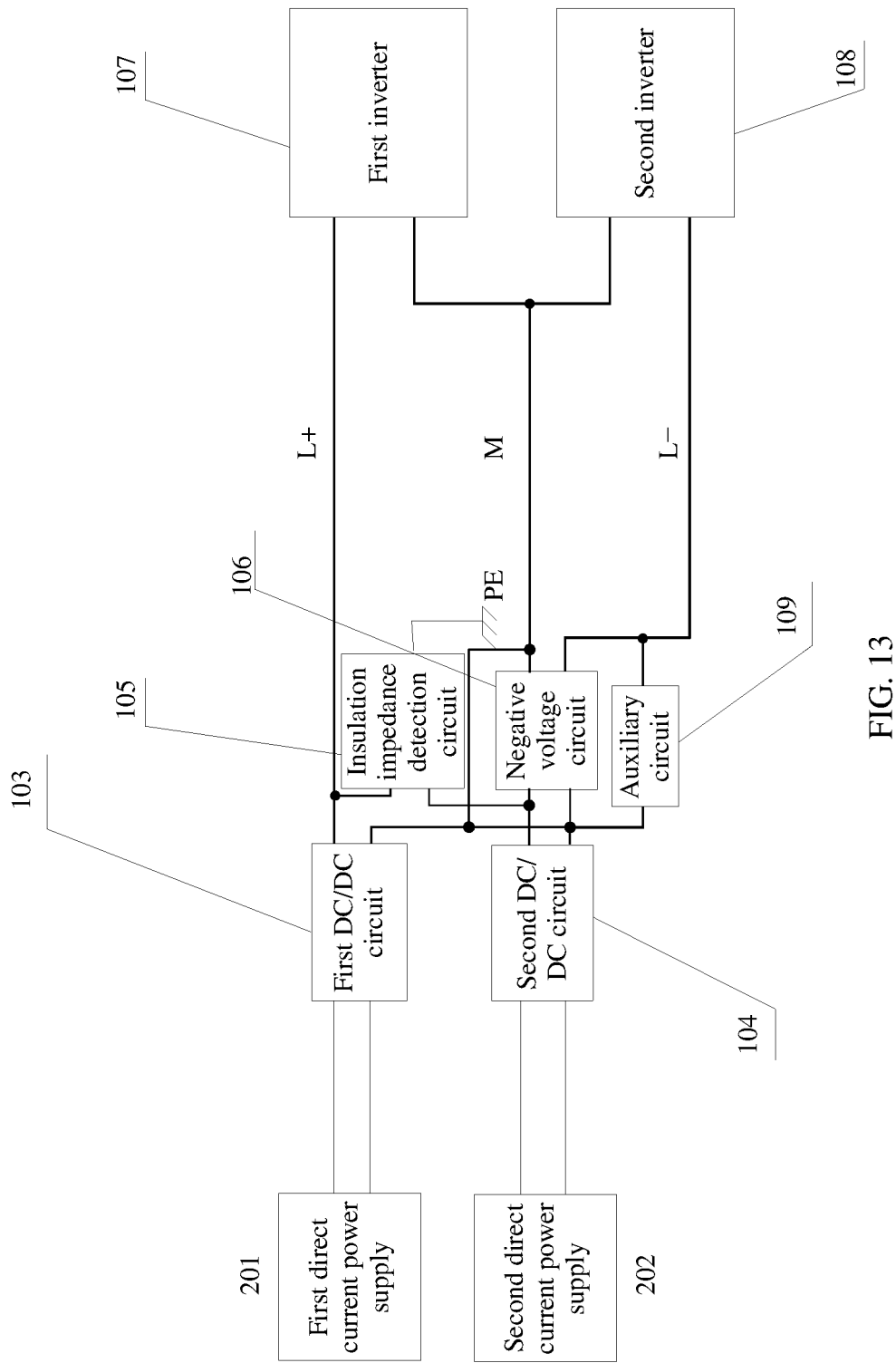
FIG. 13 is a schematic diagram of another power supply system according to an embodiment.

An implementation of the power supply system provided in this embodiment is described below with reference to FIG. 13. The power supply system may further include a power conversion circuit. The power conversion circuit includes a first DC/DC circuit 103, a second DC/DC circuit 104, and a negative voltage circuit 106.

An input end of the first DC/DC circuit 103 is configured to connect to a first direct current power supply 201, and an input end of the second DC/DC circuit 104 is configured to connect to a second direct current power supply 202.

A positive output end and a negative output end of the first DC/DC circuit 103 are respectively configured to connect to a direct current positive bus L+ and a neutral bus M.

A positive output end and a negative output end of the second DC/DC circuit 104 are respectively connected to a first input end and a second input end of the negative voltage circuit 106, a first output end and a second output end of the negative voltage circuit 106 are respectively configured to connect to the neutral bus M and a direct current negative bus, and the negative output end of the second DC/DC circuit 104 is configured to connect to the neutral bus M.

That an insulation impedance detection circuit 105 is connected between the direct current positive bus L+ and the ground PE is still used as an example for description.

A first end of the insulation impedance detection circuit 105 is connected to the direct current positive bus L+, a second end of the insulation impedance detection circuit 105 is connected to the positive output end of the second DC/DC circuit 104, and both the first end and the second end of the insulation impedance detection circuit 105 are grounded by using a switch and a resistor that are connected in series.

A controller is configured to obtain insulation impedance based on the resistor and voltages to ground of the direct current positive bus L+ that are separately corresponding to the switch before and after the switch is turned on. For an obtaining manner, refer to the descriptions in the embodiment of the photovoltaic system. Details are not described herein again.

After the controller obtains the insulation impedance, the controller may determine, based on the insulation impedance, whether there is an insulation fault in the power supply system. When the obtained insulation impedance is less than a preset threshold, it indicates that there is an insulation fault in the power supply system. In this case, the controller may control both the first direct current power supply and the second direct current power supply to be disconnected from the power conversion circuit, for example, disconnect the direct current power supply from the DC/DC circuit. In addition, the controller may also control the two DC/DC circuits to stop working, and control two connected lower-level inverters to be shut down.

Figure 14:
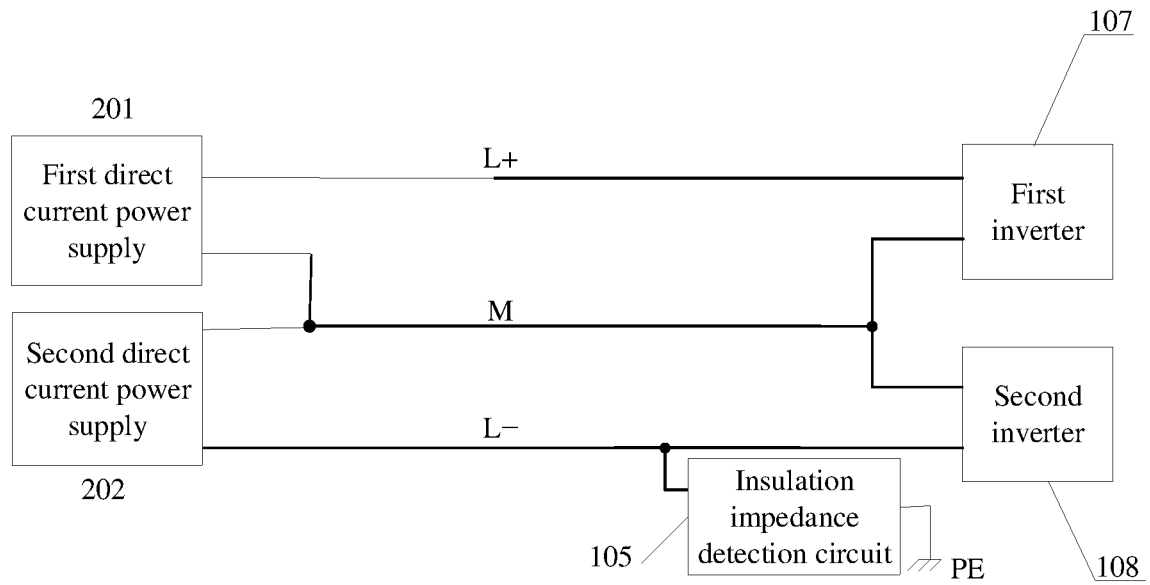
FIG. 14 is a schematic diagram of still another power supply system according to an embodiment.

FIG. 14 is a schematic diagram of still another power supply system according to an embodiment.

The power supply system provided in this embodiment is described by using an example in which the insulation impedance detection circuit 105 is connected between the direct current negative bus L− and the ground PE.

A first end of the insulation impedance detection circuit 105 is connected to the direct current negative bus L−, and a second end of the insulation impedance detection circuit 105 is grounded by using a switch and a resistor that are connected in series.

The controller is configured to obtain insulation impedance based on the resistor and voltages to ground of the direct current negative bus that are separately corresponding to the switch before and after the switch is turned on. For an obtaining manner, refer to the descriptions in the embodiment of the photovoltaic system. Details are not described herein again.

Figure 15:
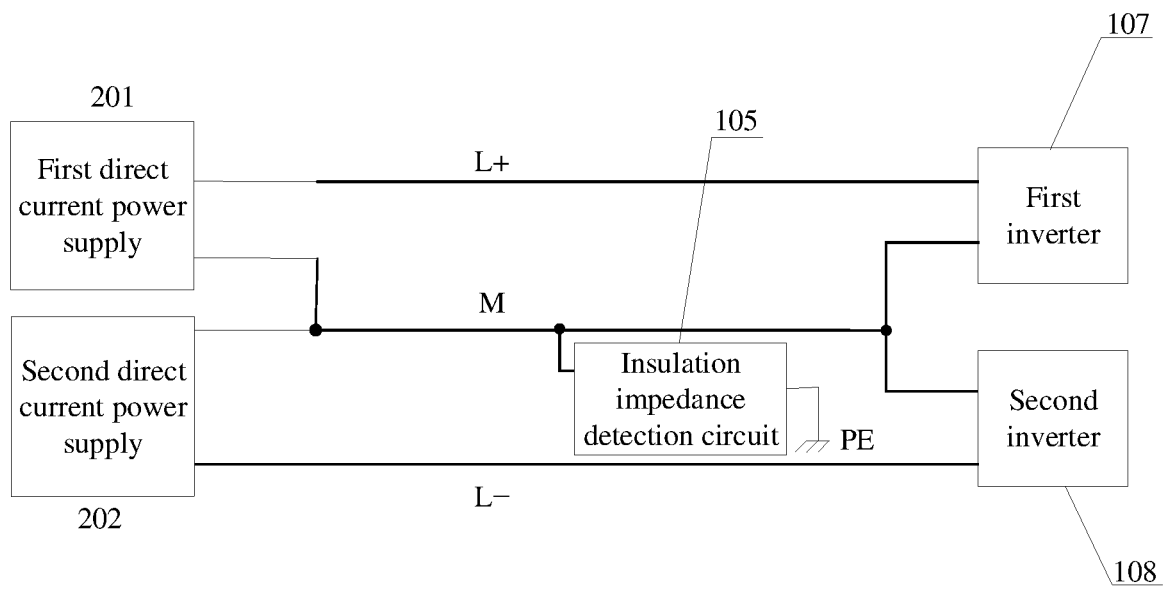
FIG. 15 is a schematic diagram of yet another power supply system according to an embodiment.

FIG. 15 is a schematic diagram of yet another power supply system according to an embodiment.

In the power supply system provided in this embodiment, the insulation impedance detection circuit 105 is connected between the neutral bus M and the ground PE.

A first end of the insulation impedance detection circuit 105 is connected to the neutral bus M, and a second end of the insulation impedance detection circuit 105 is grounded by using a switch and a resistor that are connected in series.

The controller is configured to obtain insulation impedance based on the resistor and voltages to ground of the neutral bus that are separately corresponding to the switch before and after the switch is turned on. For an obtaining manner, refer to the descriptions in the embodiment of the photovoltaic system. Details are not described herein again.

Method Embodiment

Based on the photovoltaic system provided in the foregoing embodiment, an embodiment may further provide an insulation fault detection method for a photovoltaic system. Detailed descriptions are provided below with reference to the accompanying drawings.

Figure 16:
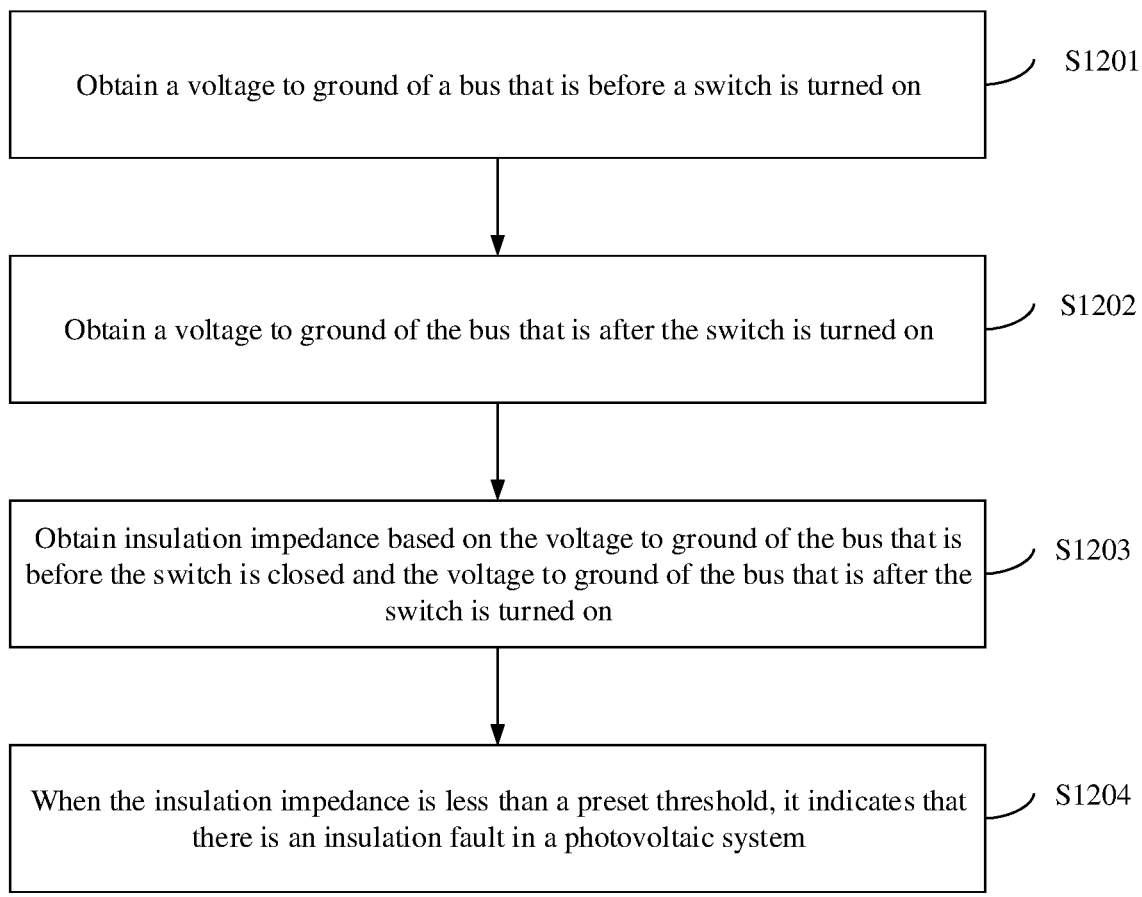
FIG. 16 is a flowchart of an insulation fault detection method for a photovoltaic system according to an embodiment.

FIG. 16 is a flowchart of an insulation fault detection method for a photovoltaic system according to an embodiment.

The insulation fault detection method for a photovoltaic system provided in this embodiment may be applied to the photovoltaic system described in any one of the foregoing embodiments. The photovoltaic system includes a first DC/DC circuit, a second DC/DC circuit, a negative voltage circuit, an insulation impedance detection circuit, and a controller. An input end of the first DC/DC circuit is configured to connect to a corresponding photovoltaic string. An input end of the second DC/DC circuit is configured to connect to a corresponding photovoltaic string. A positive output end and a negative output end of the first DC/DC circuit are respectively configured to connect to a direct current positive bus and a neutral bus. A positive output end and a negative output end of the second DC/DC circuit are respectively connected to a first input end and a second input end of the negative voltage circuit. A first output end and a second output end of the negative voltage circuit are respectively configured to connect to the neutral bus and a direct current negative bus. The negative output end of the second DC/DC circuit is configured to connect to the neutral bus. The insulation impedance detection circuit is connected between a bus and the ground, and the bus includes the direct current positive bus, the neutral bus, or the direct current negative bus. The insulation impedance detection circuit includes at least a switch. The direct current negative bus is connected to the neutral bus by using an electrical element or a voltage source.

The method includes the following steps:

S1201: Obtain a voltage to ground of the bus that is before the switch is turned on, that is, obtain a voltage to ground of the bus that is when the switch is turned off, for example, when an insulation impedance detection circuit is connected between the direct current positive bus and the ground, obtain a voltage to ground of the direct current positive bus that is when the switch is turned off.

S1202: Obtain a voltage to ground of the bus that is after the switch is turned on, for example, obtain a voltage to ground of the direct current positive bus that is after the switch is turned on.

S1203: Obtain insulation impedance based on the voltage to ground of the bus that is before the switch is turned on and the voltage to ground of the bus that is after the switch is turned on. For details, refer to descriptions corresponding to FIG. 7 and FIG. 8. The insulation impedance may be obtained by using Thevenin's theorem.

S1204: When the insulation impedance is less than a preset threshold, it indicates that there is an insulation fault in the photovoltaic system.

When there is an insulation fault in the photovoltaic system, the insulation impedance decreases. Therefore, the insulation impedance may be compared with the preset threshold. When the insulation impedance is less than the preset threshold, it indicates that there is an insulation fault in the photovoltaic system.

The insulation impedance is a parallel value of insulation impedance of the side of a photovoltaic array to PE and insulation impedance of the direct current positive bus L+ and the direct current negative bus L− to the PE. Therefore, in the photovoltaic system provided in this embodiment, when it is detected that there is an insulation fault in the photovoltaic system, the insulation fault may be an insulation fault of the direct current positive bus L+, an insulation fault of the direct current negative bus L− to the ground, or an insulation fault of the side of the photovoltaic array to the ground.

The photovoltaic system provided in this embodiment may include the direct current positive bus, the neutral bus, and the direct current negative bus. Therefore, an insulation status of the direct current positive bus and an insulation status of the direct current negative bus need to be detected, and an insulation status of the photovoltaic array also needs to be detected. However, a conventional insulation impedance detection circuit cannot comprehensively detect an insulation fault of such a multi-bus photovoltaic system provided in this embodiment. Therefore, to comprehensively detect an insulation fault in the photovoltaic system provided in the embodiments, an embodiment may provide an insulation fault detection manner. The insulation impedance detection circuit is connected between any one of three buses and the ground, the three buses include the direct current positive bus L+, the neutral bus M, and the direct current negative bus L−, and the direct current negative bus L− may be connected to the neutral bus M by using an auxiliary circuit, that is, the direct current negative bus L− and the neutral bus M form a path, to ensure that the insulation impedance detection circuit can also detect an insulation status of the direct current negative bus L− to the ground. The auxiliary circuit includes at least an electrical element or a voltage source. The insulation impedance detection circuit includes at least a switch, and an insulation status of the photovoltaic system may be obtained based on voltages to ground of the bus that are separately corresponding to the switch before and after the switch is turned on. When there is an insulation fault in the direct current positive bus L+, the direct current negative bus L−, or a level-1 photovoltaic array, magnitude of the insulation impedance is affected. Therefore, in the insulation detection method for a photovoltaic system provided in this embodiment, an insulation fault can be comprehensively detected.

It should be understood that, "at least one (item)" means one or more, and "a plurality of" means two or more. "And/or" is used for describing an association relationship between associated objects and represents that three relationships may exist. For example, "A and/or B" may represent the following three cases: only A exists, only B exists, and both A and B exist, where A and B may be singular or plural. A character "/" may indicate an "or" relationship between the associated objects. "At least one of the following items (pieces)" or a similar expression thereof means any combination of these items, including any combination of singular items (pieces) or plural items (pieces). For example, at least one of a, b, or c may indicate a, b, c, "a and b", "a and c", "b and c", or "a, b, and c", where a, b, and c may be singular or plural.

The foregoing embodiments are merely intended for describing the embodiments and are not limiting. Although described in detail with reference to the foregoing embodiments, persons of ordinary skill in the art should understand that they may still make modifications to the embodiments without departing from their spirit and scope.

What is claimed is:

1. A photovoltaic system, comprising:
   an input end of a first DC/DC circuit configured to connect to a corresponding photovoltaic string;
   an input end of a second DC/DC circuit configured to connect to a corresponding photovoltaic string;
   a positive output end and a negative output end of the first DC/DC circuit respectively configured to connect to a direct current positive bus and a neutral bus;
   a positive output end and a negative output end of the second DC/DC circuit respectively connected to a first input end and a second input end of a negative voltage circuit, a first output end and a second output end of the negative voltage circuit respectively configured to connect to the neutral bus and a direct current negative bus, and the negative output end of the second DC/DC circuit configured to connect to the neutral bus;
   an insulation impedance detection circuit connected between a bus and the ground, wherein the bus comprises the direct current positive bus, the neutral bus, or the direct current negative bus, the insulation impedance detection circuit comprises at least a switch, and the direct current negative bus is connected to the neutral bus by using an electrical element or a voltage source; and a controller configured to:

obtain insulation impedance based on voltages to ground of the bus that are separately corresponding to the switch before and after the switch is turned on, and detect, based on the insulation impedance, whether there is an insulation fault in the photovoltaic system.

2. The photovoltaic system according to claim 1, wherein the controller is further configured to obtain the insulation impedance based on a voltage to ground of the bus that is before the switch is turned on and a voltage to ground of the bus that is after the switch is turned on, and after the insulation impedance is less than a preset threshold, indicates that there is an insulation fault in the photovoltaic system.

3. The photovoltaic system according to claim 1, wherein the insulation impedance detection circuit comprises at least the switch and a resistor that are connected in series.

4. The photovoltaic system according to claim 1, wherein the electrical element comprises at least one of the following: a resistor, a relay, an IGBT transistor, a MOS transistor, an inductor, and a diode.

5. The photovoltaic system according to claim 4, wherein the electrical element comprises a first diode; and an anode of the first diode is connected to the direct current negative bus, and a cathode of the first diode is connected to the neutral bus.

6. The photovoltaic system according to claim 1, wherein the insulation impedance detection circuit is connected between the direct current positive bus and the ground;

a first end of the insulation impedance detection circuit is connected to the direct current positive bus, a second end of the insulation impedance detection circuit is connected to the positive output end of the second DC/DC circuit, and both the first end and the second end of the insulation impedance detection circuit are grounded by using the switch and the resistor that are connected in series; and the controller is configured to obtain the insulation impedance based on voltages to ground of the direct current positive bus that are separately corresponding to the switch before and after the switch is turned on and the resistor.

7. The photovoltaic system according to claim 6, wherein the insulation impedance detection circuit further comprises:

a first isolation circuit;

a first end of the first isolation circuit is connected to the second end of the insulation impedance detection circuit, and a second end of the first isolation circuit is grounded by using the resistor and the switch that are connected in series; and the first isolation circuit comprises at least one of the following: a resistor, a relay, an IGBT transistor, a MOS transistor, an inductor, or a diode.

8. The photovoltaic system according to claim 7, wherein the first isolation circuit comprises a second diode; and an anode of the second diode is connected to the second end of the insulation impedance detection circuit, and a cathode of the second diode is grounded by using the resistor and the switch that are connected in series.

9. The photovoltaic system according to claim 6, wherein the insulation impedance detection circuit further comprises;

a second isolation circuit;

a first end of the second isolation circuit is connected to the first end of the insulation impedance detection circuit, and a second end of the second isolation circuit is grounded by using the resistor and the switch that are connected in series; and the second isolation circuit comprises at least one of the following: a resistor, a relay, an IGBT transistor, a MOS transistor, an inductor, or a diode.

10. The photovoltaic system according to claim 9, wherein the second isolation circuit further comprises a third diode; and an anode of the third diode is connected to the first end of the insulation impedance detection circuit, and a cathode of the third diode is grounded by using the resistor and the switch that are connected in series.

11. The photovoltaic system according to claim 1, wherein the insulation impedance detection circuit is connected between the direct current negative bus and the ground;

a first end of the insulation impedance detection circuit is connected to the direct current negative bus, and a second end of the insulation impedance detection circuit is grounded by using the switch and the resistor that are connected in series; and the controller is configured to obtain the insulation impedance based on voltages to ground of the direct current negative bus that are separately corresponding to the switch before and after the switch is turned on and the resistor.

12. The photovoltaic system according to claim 1, wherein the insulation impedance detection circuit is connected between the neutral bus and the ground;

a first end of the insulation impedance detection circuit is connected to the neutral bus, and a second end of the insulation impedance detection circuit is grounded by using the switch and the resistor that are connected in series; and the controller is configured to obtain the insulation impedance based on voltages to ground of the neutral bus that are separately corresponding to the switch before and after the switch is turned on and the resistor.

13. The photovoltaic system according to claim 1, wherein the first DC/DC circuit, the second DC/DC circuit, the negative voltage circuit, and the insulation impedance detection circuit are integrated in a direct current combiner box.

14. The photovoltaic system according to claim 1, further comprising:

a first inverter, wherein a first input end and a second input end of the first inverter are respectively configured to connect to the direct current positive bus and the neutral bus; and a second inverter, wherein a first input end and a second input end of the second inverter are respectively configured to connect to the neutral bus and the direct current negative bus.

15. A power supply system, comprising:

an insulation impedance detection circuit connected between a bus and the ground, wherein the bus comprises a direct current positive bus, a neutral bus, or a direct current negative bus, the direct current positive bus and the neutral bus correspond to a first direct current power supply, and the neutral bus and the direct current negative bus correspond to a second direct current power supply; and the insulation impedance detection circuit comprises at least a switch, and the direct current negative bus is connected to the neutral bus by using an electrical element or a voltage source; and a controller configured to: obtain insulation impedance based on voltages to ground of the bus that are separately corresponding to the switch before and after the switch is turned on, and detect, based on the insulation impedance, whether there is an insulation fault in the power supply system.

16. The power supply system according to claim 15, further comprising:
a first DC/DC circuit;
a second DC/DC circuit; and
a negative voltage circuit, wherein
an input end of the first DC/DC circuit is configured to connect to the first direct current power supply, and an input end of the second DC/DC circuit is configured to connect to the second direct current power supply;
a positive output end and a negative output end of the first DC/DC circuit are respectively configured to connect to the direct current positive bus and the neutral bus; and
a positive output end and a negative output end of the second DC/DC circuit are respectively connected to a first input end and a second input end of the negative voltage circuit, a first output end and a second output end of the negative voltage circuit are respectively configured to connect to the neutral bus and the direct current negative bus, and the negative output end of the second DC/DC circuit is configured to connect to the neutral bus.

17. The power supply system according to claim 15, wherein the insulation impedance detection circuit is connected between the direct current positive bus and the ground;
a first end of the insulation impedance detection circuit is connected to the direct current positive bus, a second end of the insulation impedance detection circuit is connected to the positive output end of the second DC/DC circuit, and both the first end and the second end of the insulation impedance detection circuit are grounded by using the switch and a resistor that are connected in series; and
the controller is configured to obtain the insulation impedance based on voltages to ground of the direct current positive bus that are separately corresponding to the switch before and after the switch is turned on and the resistor.

18. The power supply system according to claim 15, wherein the insulation impedance detection circuit is connected between the direct current negative bus and the ground;
a first end of the insulation impedance detection circuit is connected to the direct current negative bus, and a second end of the insulation impedance detection circuit is grounded by using the switch and a resistor that are connected in series; and
the controller is configured to obtain the insulation impedance based on voltages to ground of the direct current negative bus that are separately corresponding to the switch before and after the switch is turned on and the resistor.

19. The power supply system according to claim 15, wherein the insulation impedance detection circuit is connected between the neutral bus and the ground;
a first end of the insulation impedance detection circuit is connected to the neutral bus, and a second end of the insulation impedance detection circuit is grounded by using the switch and a resistor that are connected in series; and
the controller is configured to obtain the insulation impedance based on voltages to ground of the neutral bus that are separately corresponding to the switch before and after the switch is turned on and the resistor.

20. A method for a photovoltaic system, wherein the photovoltaic system comprises a first DC/DC circuit, a second DC/DC circuit, a negative voltage circuit, an insulation impedance detection circuit, and a controller, an input end of the first DC/DC circuit is configured to connect to a corresponding photovoltaic string, an input end of the second DC/DC circuit is configured to connect to a corresponding photovoltaic string, a positive output end and a negative output end of the first DC/DC circuit are respectively configured to connect to a direct current positive bus and a neutral bus, a positive output end and a negative output end of the second DC/DC circuit are respectively connected to a first input end and a second input end of the negative voltage circuit, a first output end and a second output end of the negative voltage circuit are respectively configured to connect to the neutral bus and the direct current negative bus, the negative output end of the second DC/DC circuit is configured to connect to the neutral bus, the insulation impedance detection circuit is connected between a bus and the ground, the bus comprises the direct current positive bus, the neutral bus, or the direct current negative bus, the insulation impedance detection circuit comprises at least a switch, and the direct current negative bus is connected to the neutral bus by using an electrical element or a voltage source; and the method comprising:
obtaining a voltage to ground of the bus that is before the switch is turned on;
obtaining a voltage to ground of the bus that is after the switch is turned on;
obtaining insulation impedance based on the voltage to ground of the bus that is before the switch is turned on and the voltage to ground of the bus that is after the switch is turned on; and
detecting, based on the insulation impedance, whether there is an insulation fault in the photovoltaic system.

* * * * *

UNITED STATES PATENT AND TRADEMARK OFFICE
CERTIFICATE OF CORRECTION

| | | |
|---|---|---|
| PATENT NO. | : 12,401,320 B2 | Page 1 of 1 |
| APPLICATION NO. | : 18/450528 | |
| DATED | : August 26, 2025 | |
| INVENTOR(S) | : Jianfei Lin et al. | |

It is certified that error appears in the above-identified patent and that said Letters Patent is hereby corrected as shown below:

In the Claims

Column 21, Claim 2, Line 19, please change "indicates" to "indicate".

Signed and Sealed this
Twenty-eighth Day of October, 2025

John A. Squires
*Director of the United States Patent and Trademark Office*